(12) United States Patent
Sharon et al.

(10) Patent No.: US 8,154,918 B2
(45) Date of Patent: Apr. 10, 2012

(54) METHOD FOR PAGE- AND BLOCK BASED SCRAMBLING IN NON-VOLATILE MEMORY

(75) Inventors: Eran Sharon, Rishon Lezion (IL); Idan Alrod, Herzliya (IL)

(73) Assignee: SanDisk IL Ltd., Kfar Saba (IL)

( * ) Notice: Subject to any disclaimer, the term of this patent is extended or adjusted under 35 U.S.C. 154(b) by 811 days.

(21) Appl. No.: 12/251,820

(22) Filed: Oct. 15, 2008

(65) Prior Publication Data

US 2009/0323942 A1 Dec. 31, 2009

Related U.S. Application Data

(60) Provisional application No. 61/076,791, filed on Jun. 30, 2008.

(51) Int. Cl.
*G11C 11/34* (2006.01)
(52) U.S. Cl. ......... 365/185.02; 365/185.11; 365/185.12; 380/46; 713/193
(58) Field of Classification Search ............. 365/185.02, 365/185.11, 185.12; 380/46; 713/193
See application file for complete search history.

(56) References Cited

U.S. PATENT DOCUMENTS

| 5,621,799 | A | 4/1997 | Katta |
| 5,943,283 | A | 8/1999 | Wong |
| 6,826,111 | B2 * | 11/2004 | Schneider et al. ....... 365/230.06 |
| 7,398,387 | B2 * | 7/2008 | Liang .......................... 713/162 |
| 7,984,232 | B2 * | 7/2011 | Kimura ........................ 711/103 |
| 2003/0145196 | A1 | 7/2003 | Heegard |
| 2007/0242552 | A1 | 10/2007 | Ju |
| 2008/0052444 | A1 | 2/2008 | Hwang |
| 2008/0065813 | A1 | 3/2008 | Li |
| 2008/0151618 | A1 | 6/2008 | Sharon |
| 2008/0215798 | A1 | 9/2008 | Sharon |
| 2009/0172266 | A1 | 7/2009 | Kimura |

FOREIGN PATENT DOCUMENTS

| EP | 0909051 | 4/1999 |
| EP | 1130600 | 9/2001 |
| EP | 1684308 | 7/2006 |

OTHER PUBLICATIONS

International Preliminary Report on Patentability dated Jan. 5, 2011, International Application No. PCT/IL2009/000629 filed Jun. 24, 2009.
International Search Report and Written Opinion dated Oct. 16, 2009, PCT Patent Appl. PCT/IL2009/000629.

* cited by examiner

*Primary Examiner* — Alexander Sofocleous
(74) *Attorney, Agent, or Firm* — Vierra Magen Marcus & DeNiro LLP

(57) ABSTRACT

A method and system for programming and reading data with reduced read errors in a memory device. In one approach, date to be written to the memory device is scrambled using a first pseudo random number which is generated based on a page of the memory device to which the data is to be written, to provide first scrambled data, which is scrambled using a second pseudo random number which is generated based on a block of the memory device to which the data is to be written. This avoids bit line-to-bit line and block-to-block redundancies which can result in read errors. The data may also be scrambled using a third pseudo random number that depends on a section within a page. Scrambling may also be based on one or more previous pages which were written.

21 Claims, 20 Drawing Sheets

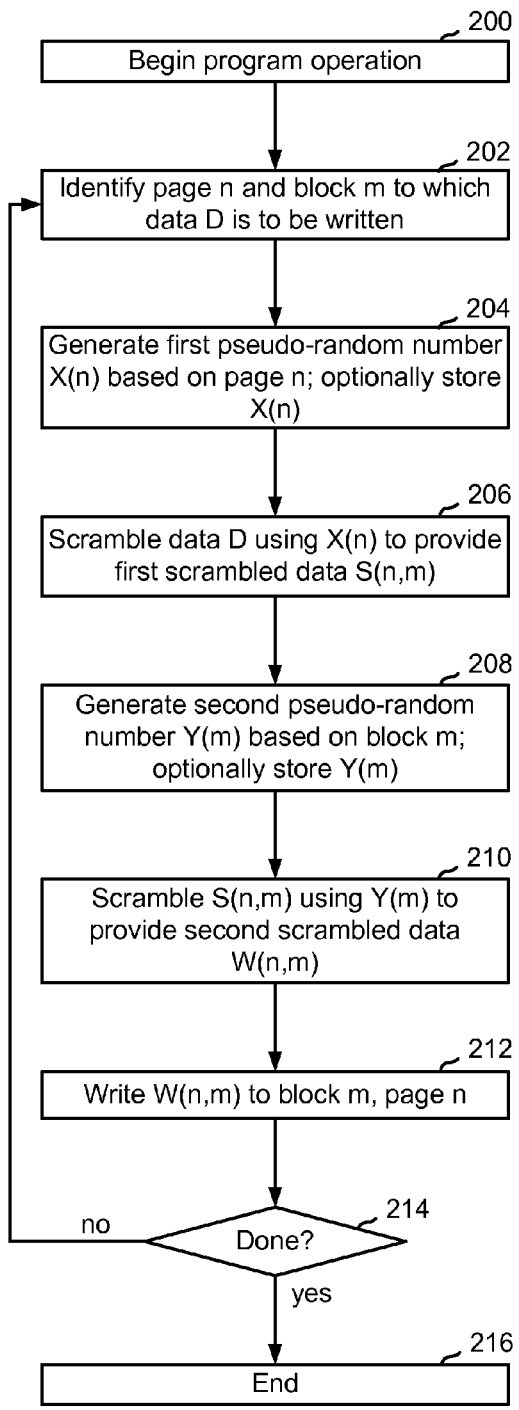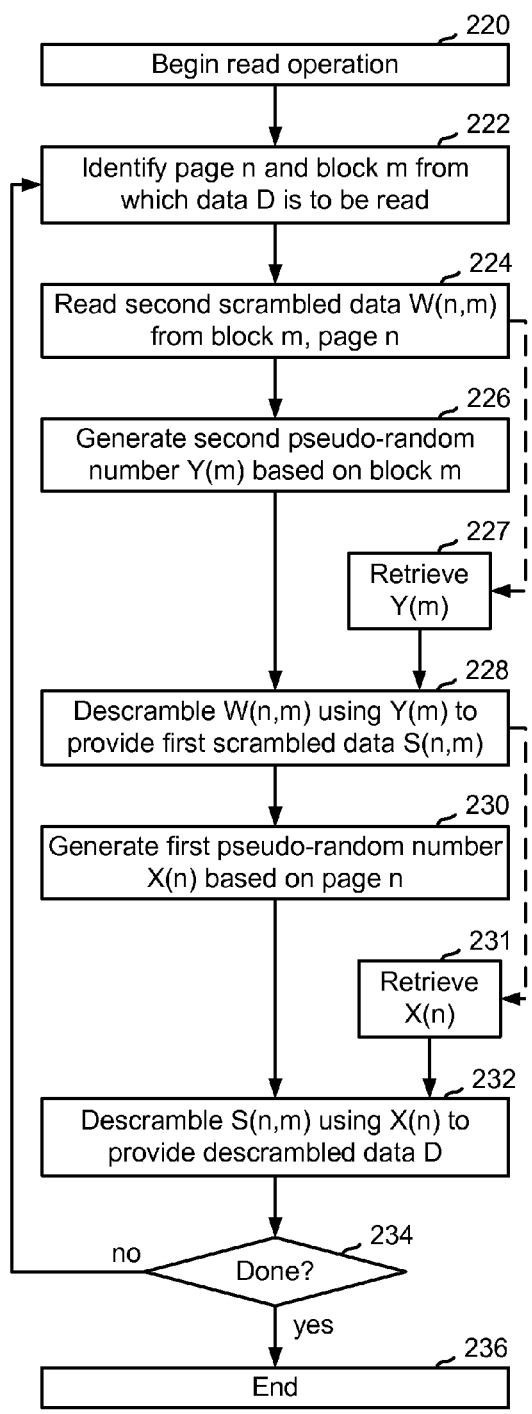

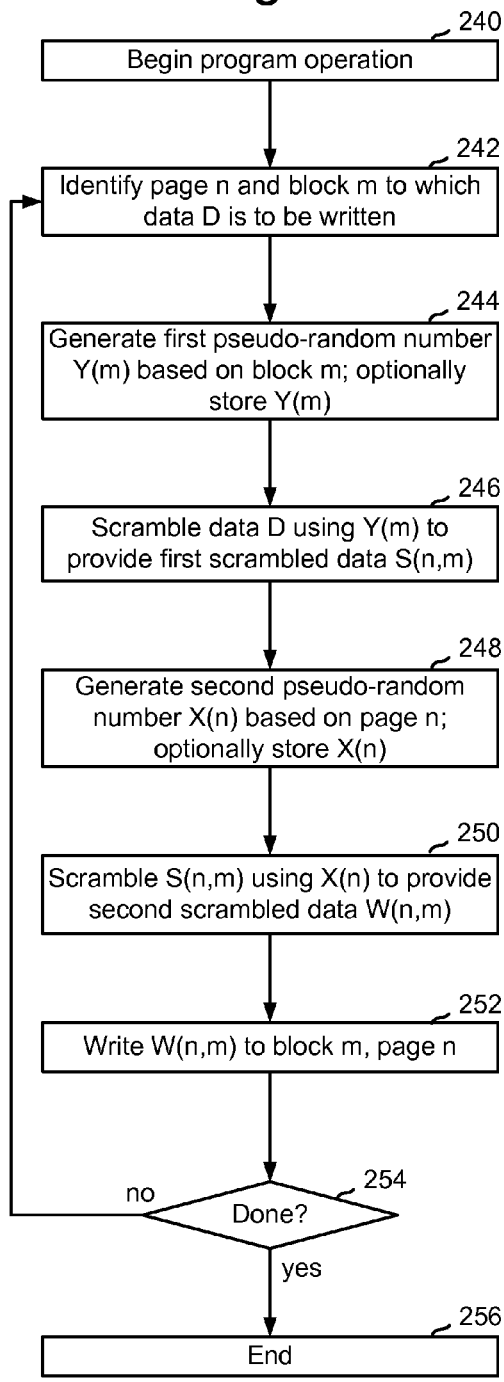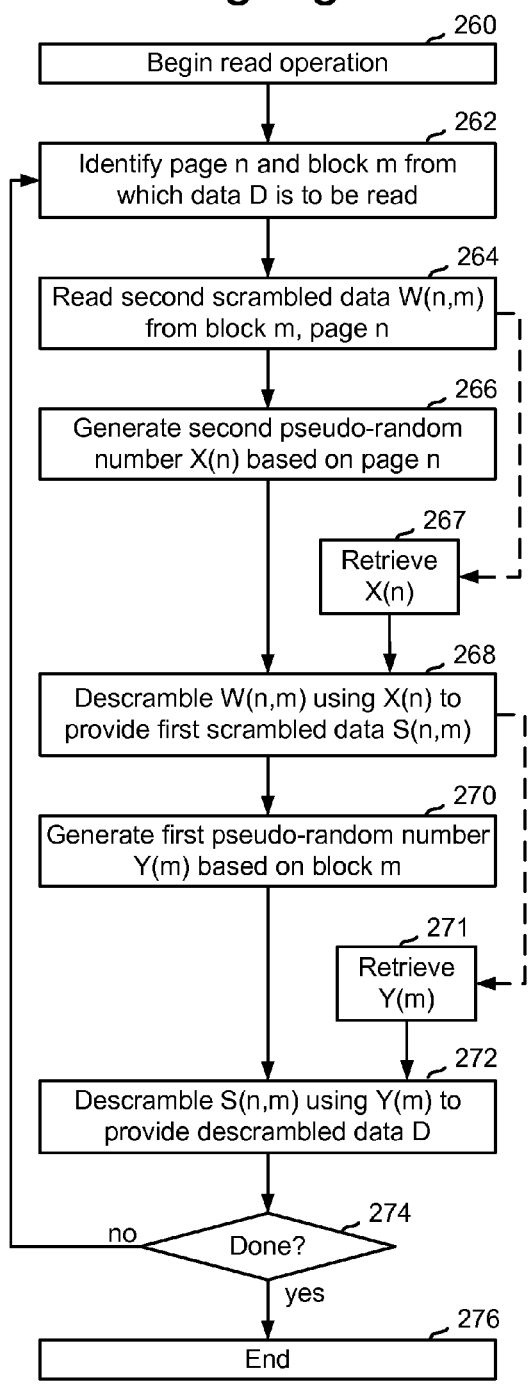

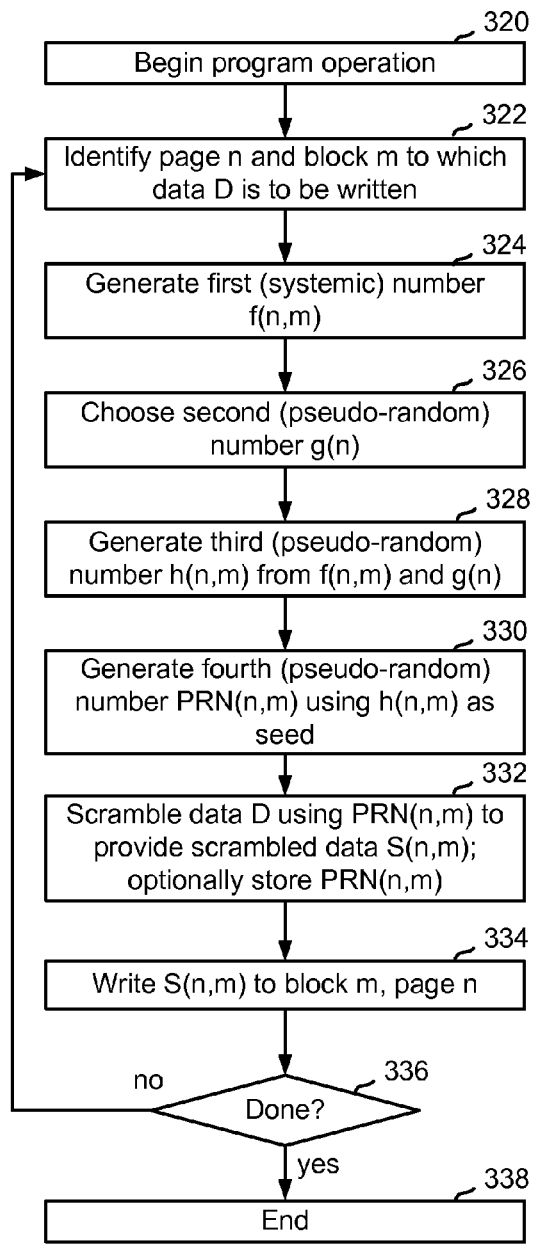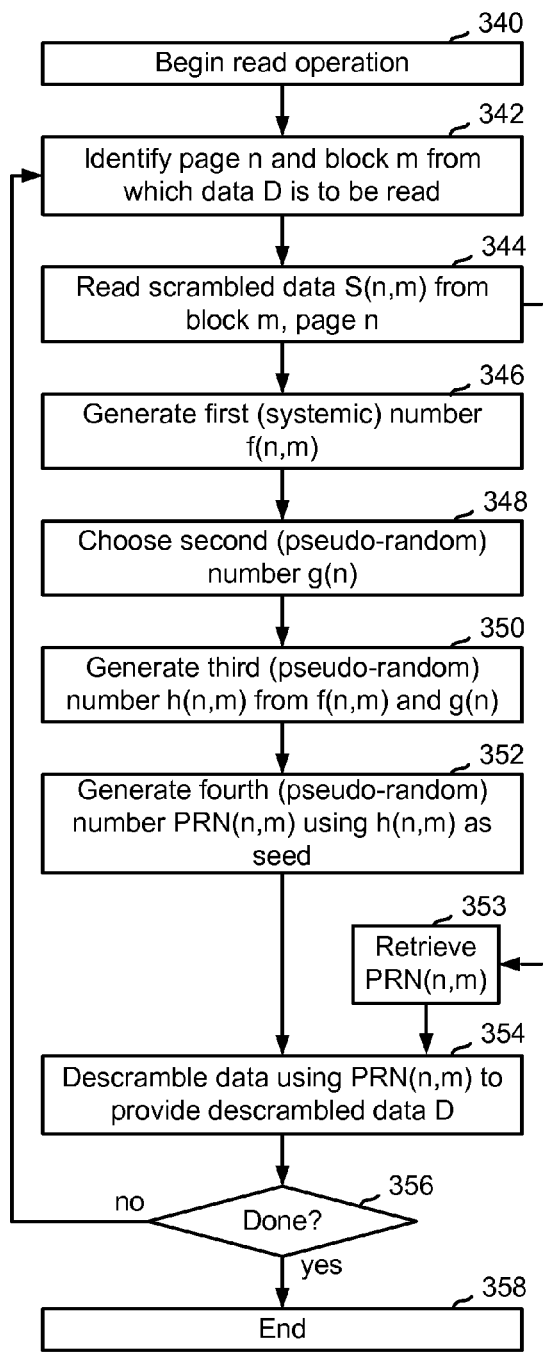

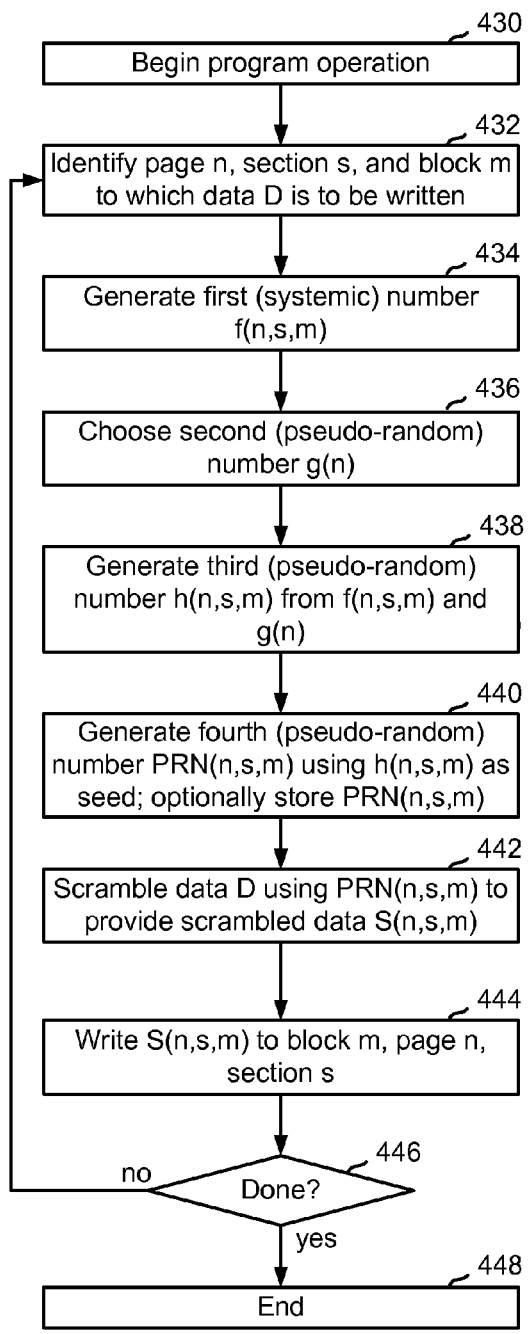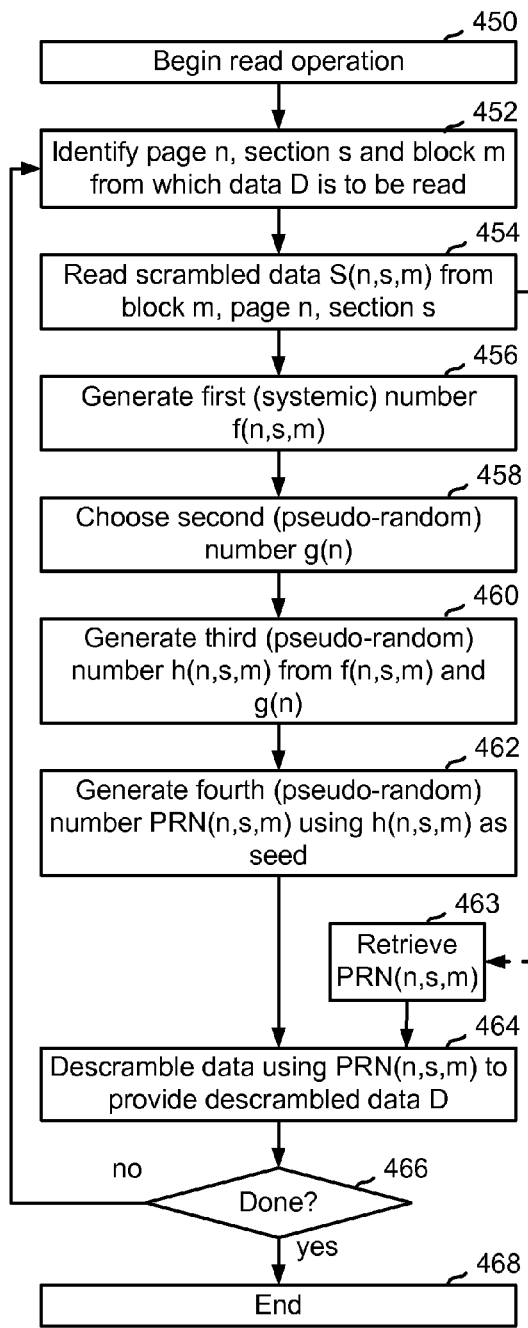

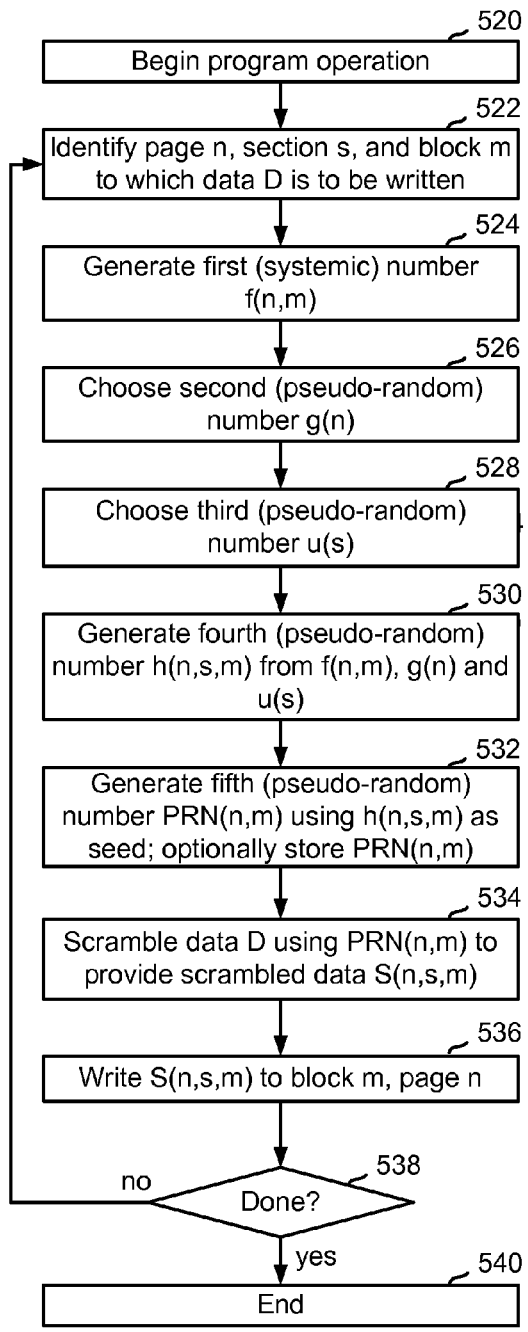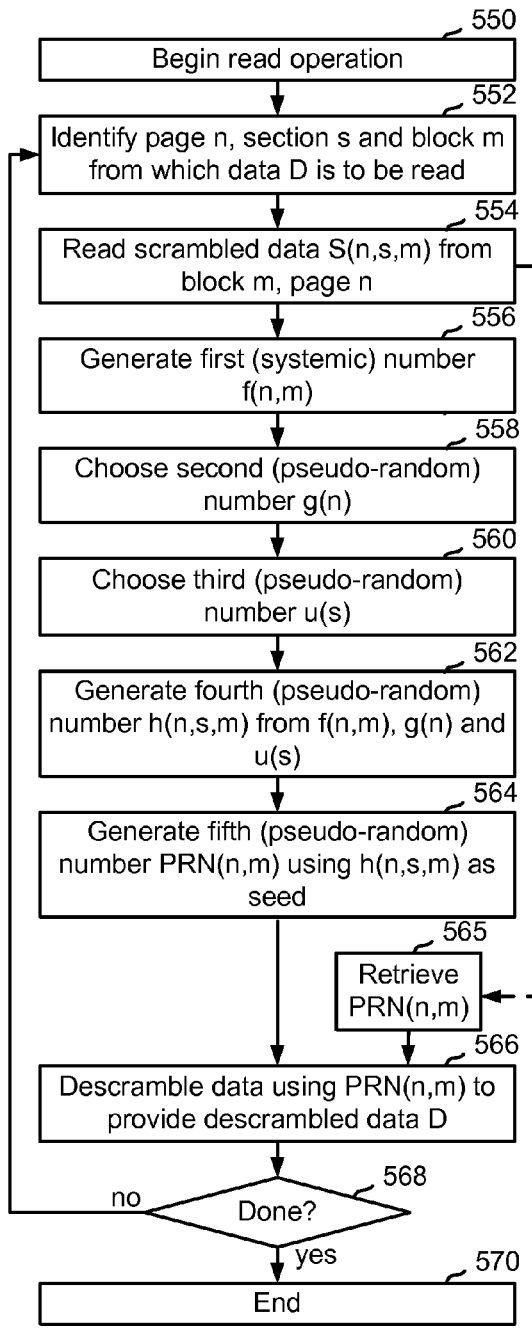

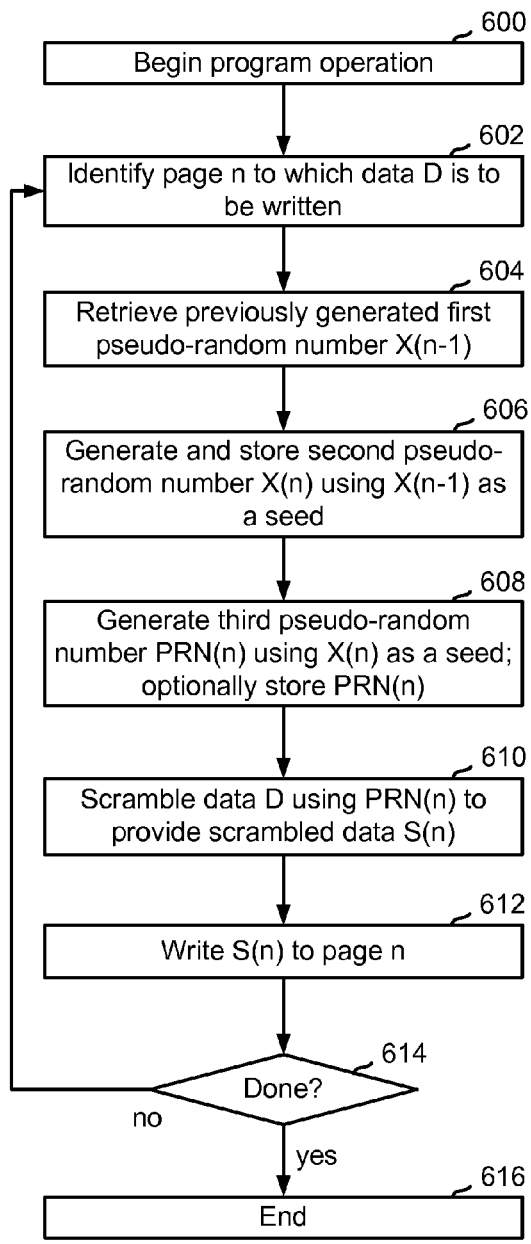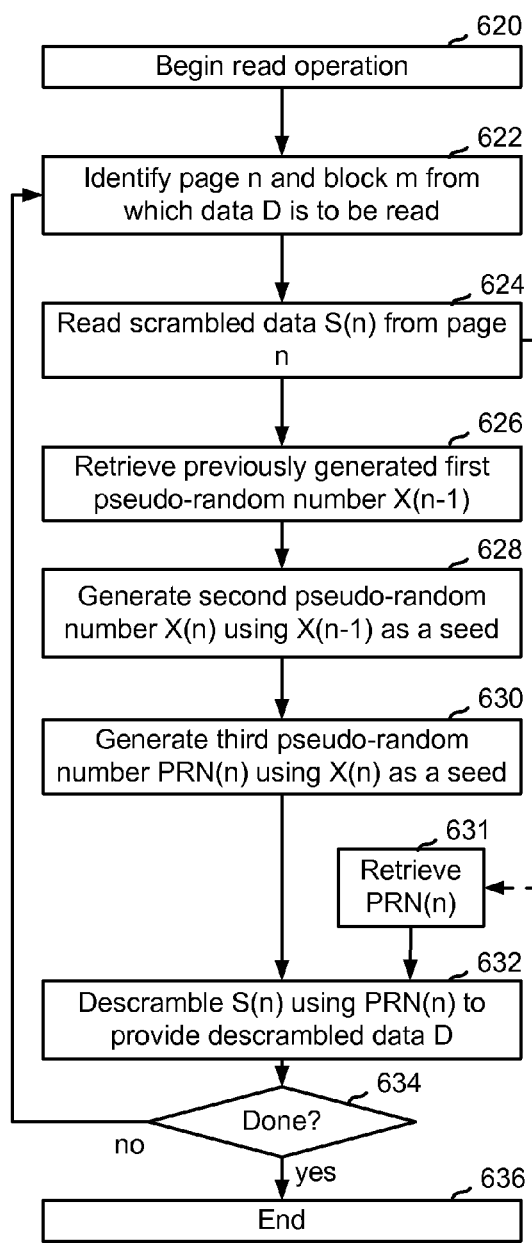

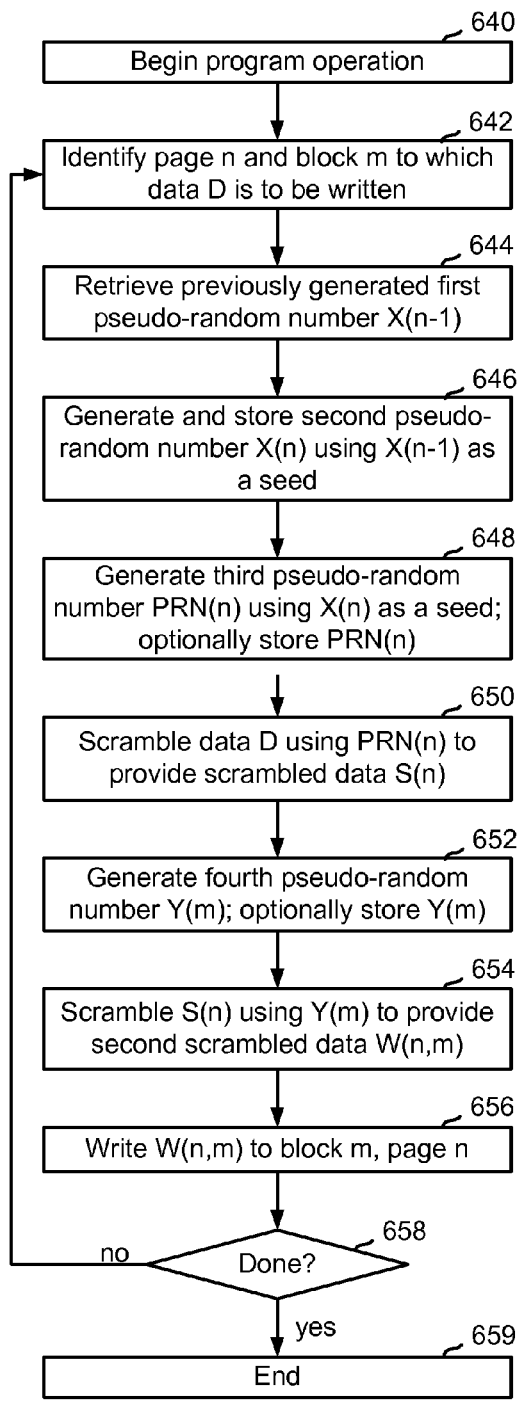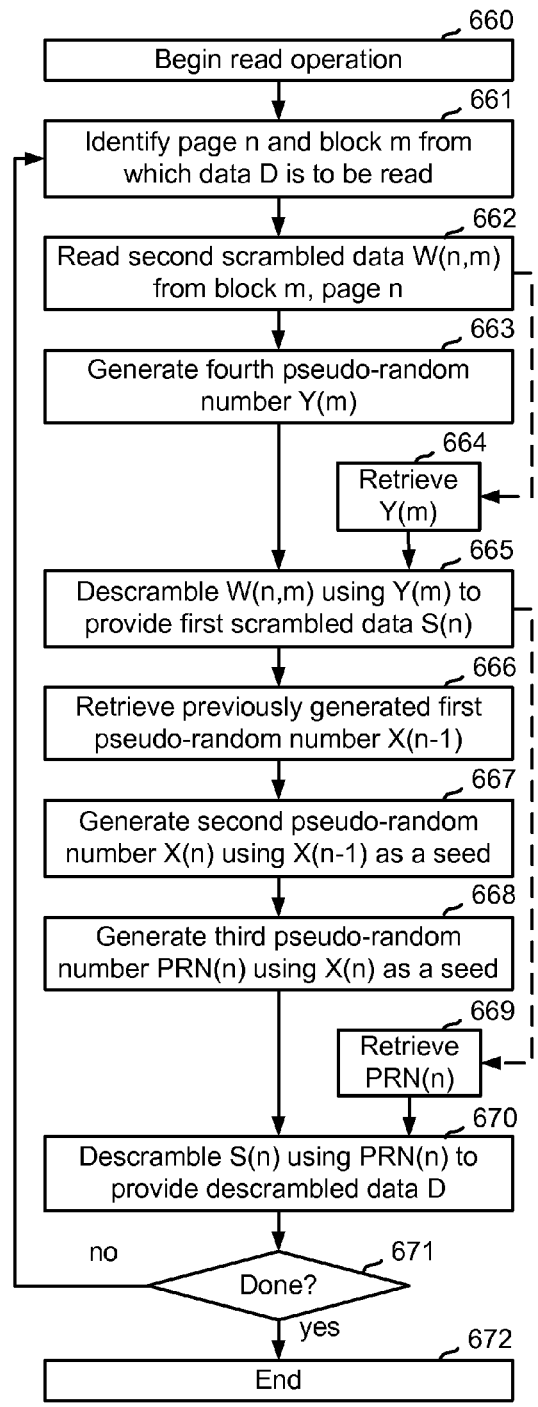

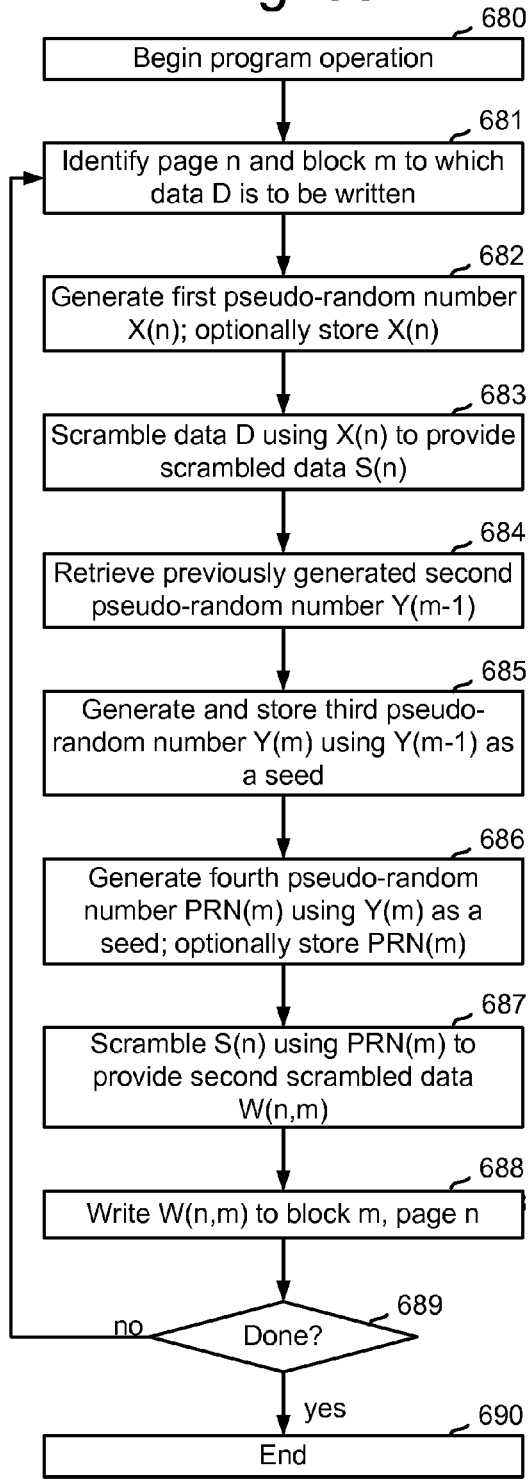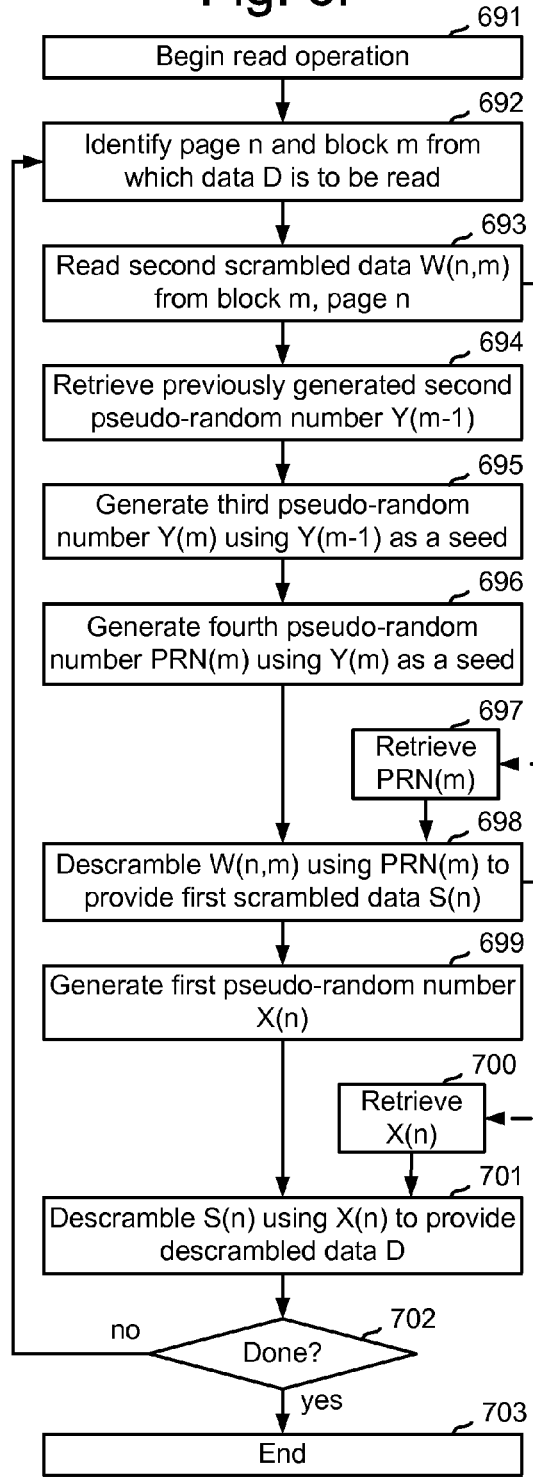

METHOD FOR PAGE- AND BLOCK BASED SCRAMBLING IN NON-VOLATILE MEMORY

CROSS-REFERENCE TO RELATED APPLICATIONS

This application claims the benefit of U.S. provisional patent application No. 61/076,791, filed Jun. 30, 2008, incorporated herein by reference.

BACKGROUND OF THE INVENTION

1. Field of the Invention

The present invention relates to a memory device.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. During a programming or write operation, a series of program voltages is applied to a set of storage elements such as on a word line to raise the threshold voltages of the storage element to specified levels which represent programmed data states. Verify operations are performed after each program pulse to determine when each storage element has reached its intended state. During a read operation in such devices, a series of read reference voltages are applied to a set of storage elements to be read, and a determination is made as to which read reference voltage causes a storage element to become conductive. The read reference voltages are set to allow different data states of the storage elements to be distinguished.

However, errors can be caused during read operations due to factors such as electromagnetic coupling between storage elements which is a function of the storage elements' respective data states. Such coupling, which can raise the threshold voltage of a storage element after it has been programmed, is particularly problematic when repeated data patterns are written to the storage elements.

SUMMARY OF THE INVENTION

The present invention addresses the above and other issues by providing a method for programming and reading data with reduced errors in a memory device.

In one embodiment, a method is provided for writing data into a page of a flash memory device, where the pages of the flash memory device are grouped into blocks that are each erasable as a single unit. The method includes receiving data to be stored in the page, scrambling the data to generate first scrambled data, where the scrambling depends on a number of the page within a block containing the page, calculating second scrambled data that is a function of the first scrambled data and a number, wherein the number depends on a block number of the block containing the page, and writing the second scrambled data into the page.

Corresponding descrambling processes may be provided for each of the scrambling processes. In one example descrambling embodiment, a method is provided for descrambling first data from a page of a flash memory device, where the pages of the flash memory device are grouped into blocks that are each erasable as a single unit. The method includes reading the first data from the page, calculating a number, wherein the number depends on a block number of a block containing the page, descrambling the first data using the number to provide second data, and descrambling the second data based on a number of the page within the block containing the page to provide third data, descrambled.

In another embodiment, a method of the above-mentioned type includes receiving data to be stored in the page, scrambling the data to generate first scrambled data, where the scrambling depends on a number and wherein the number depends on a block number of the block containing the page, calculating second scrambled data that is a function of the first scrambled data and a number of the page within the block containing the page, and writing the second scrambled data into the page.

A corresponding descrambling process includes reading first data from the page, calculating a number, wherein the number depends on a number of a page within a block containing the page, descrambling the first data using the number to provide second data, and descrambling the second data based on a number of the block containing the page to provide third data.

In another embodiment, a method of the above-mentioned type includes receiving data to be stored in the page, generating a first number that depends on a block number of the block containing the page, generating a second number that depends on a number of the page within the block containing the page, scrambling the data to generate scrambled data, where the scrambling depends on the first number and the second number, and writing the scrambled data into the page.

A corresponding descrambling process includes reading first data from the page, generating a first number that depends on a block number of the block containing the page, generating a second number that depends on a number of the page within the block containing the page, and descrambling the data based on the first number and the second number.

In another embodiment, a method of the above-mentioned type includes receiving data to be stored in the page, generating a first number that depends on a block number of the block containing the page, generating a second number that depends on a number of the page within the block containing the page, for at least one section in the page generating a third number that depends on a number of the section within the page containing the section, scrambling the data to generate scrambled data, where the scrambling depends on the first number, the second number and, for at least one section, the third number, and writing the scrambled data into the page.

A corresponding descrambling process includes generating a first number that depends on a block number of the block containing the page, generating a second number that depends on a number of the page within the block containing the page, for at least one section in the page generating a third number that depends on a number of the section within the page containing the section, and descrambling the data to generate scrambled data, where the descrambling depends on the first number, the second number and, for at least one section, the third number.

In another embodiment, a method of the above-mentioned type includes receiving data to be stored in the page, generating a scrambling key for the page as a function of one or more scrambling keys generated for one or more previous pages, scrambling the data to generate scrambled data, where the scrambling depends on the scrambling key for the page, and writing the scrambled data into the page.

A corresponding descrambling process includes generating a scrambling key for the page as a function of one or more scrambling keys generated for one or more previous pages, and descrambling the data to generate scrambled data, where the descrambling depends on the scrambling key for the page.

In another embodiment, a method of the above-mentioned type includes receiving data to be stored in the page, scrambling the data to generate scrambled data, where the scrambling depends on a hash function of a value that depends on the number of the page within the block containing the page, writing the scrambled data into the page.

A corresponding descrambling process includes descrambling the data to generate descrambled data, where the descrambling depends on a hash function of a value that depends on the number of the page within the block containing the page.

In another embodiment, a non-volatile memory device includes non-volatile storage elements arranged in blocks and pages of the blocks, and at least one controller for carrying out writing and read operations, including scrambling during write operations and corresponding descrambling during read operations. During scrambling, the at least one controller receives data to be stored in the page, scrambles the data to generate first scrambled data, where the scrambling depends on a number of the page within a block containing the page, calculates second scrambled data that is a function of the first scrambled data and a number, wherein the number depends on a block number of the block containing the page, and writes the second scrambled data into the page.

During descrambling, the at least one controller reads first data from the page, calculates a number, wherein the number depends on a block number of a block containing the page, descrambles the first data using the number to provide second data, and descrambles the second data based on a number of the page within the block containing the page to provide third, descrambled data.

Corresponding methods, systems and computer- or processor-readable storage devices which are encoded with instructions which, when executed, perform the methods provided herein, may be employed.

BRIEF DESCRIPTION OF THE DRAWINGS

FIG. 2b depicts a descrambling system which is a counterpart of FIG. 2a.

FIG. 2d depicts an example scrambling process in which data is scrambled based on a page number and then based on a block number.

FIG. 2e depicts an example descrambling process which is a counterpart of FIG. 2d.

FIG. 2f depicts an example scrambling process in which data is scrambled based on a block number and then based on a page number.

FIG. 2g depicts an example descrambling process which is a counterpart of FIG. 2f.

FIG. 3b depicts a descrambling system which is a counterpart of FIG. 3a.

FIG. 3c depicts an example scrambling process in which data is scrambled based on a page- and block-based pseudo-random number.

FIG. 3d depicts an example descrambling process which is a counterpart of FIG. 3c.

FIG. 4d depicts an example scrambling process in which data is scrambled based on a page-, section- and block-based pseudo-random number.

FIG. 4e depicts an example descrambling process which is a counterpart of FIG. 4d.

FIG. 5b depicts a descrambling system which is a counterpart of FIG. 5a.

FIG. 5c depicts an example alternative scrambling process in which data is scrambled based on a page-, section- and block-based pseudo-random number.

FIG. 5d depicts an example descrambling process which is a counterpart of FIG. 5c.

FIG. 6a depicts an example scrambling process in which data is scrambled based on scrambling data from a prior page and a current page.

FIG. 6b depicts an example descrambling process which is a counterpart of FIG. 6a.

FIG. 6c depicts an example scrambling process in which data is scrambled based on scrambling data from a prior page and a current page, and based on a current block number.

FIG. 6d depicts an example descrambling process which is a counterpart of the scrambling process of FIG. 6c.

FIG. 6e depicts an example scrambling process in which data is scrambled based on scrambling data from a prior block and a current block, and based on a current page number.

FIG. 6f depicts an example descrambling process which is a counterpart of the scrambling process of FIG. 6e.

DETAILED DESCRIPTION

The present invention provides a method and system for programming and reading data with reduced errors in a memory device.

Figure 1A:
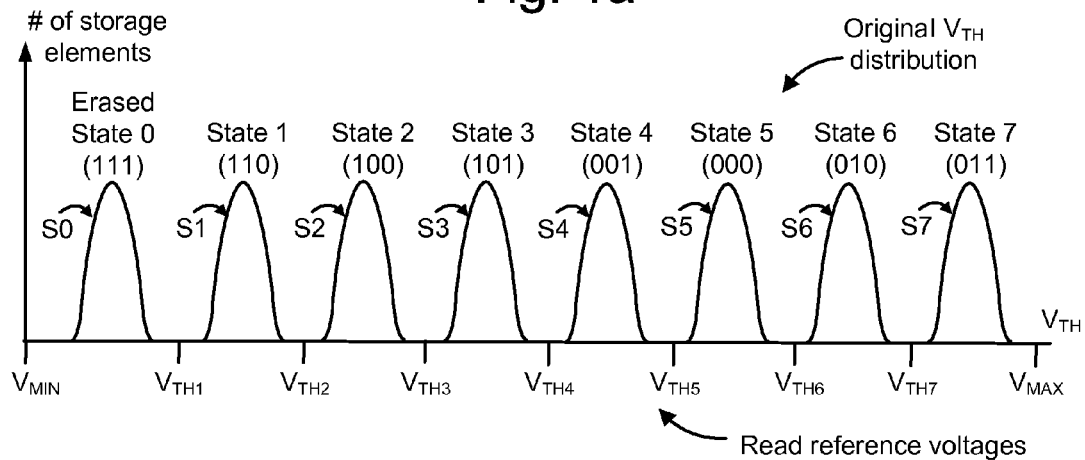
FIG. 1a depicts a threshold voltage distribution of a set of storage elements, a corresponding assignment to data states, and associated read reference voltages.

FIG. 1a depicts a threshold voltage distribution of a set of storage elements, a corresponding assignment to data states, and associated read reference voltages. The figure depicts an original or baseline threshold voltage ($V_{TH}$) distribution which exists after a set of storage elements is programmed.

For historical reasons, writing data to a flash cell is called "programming" the flash cell. The terms "writing" and "programming" are used interchangeably herein. This is done by applying voltage pulses to the cell, to inject electrons from the cell's silicon substrate through the cell's oxide layer into the cell's floating gate, until the threshold voltage of the cell is high enough within the voltage window to represent the desired bit pattern. The threshold voltage of a flash cell is in a range, called the "voltage window," as shown in FIG. 1a, from a minimum value $V_{MIN}$ to a maximum value $V_{MAX}$. For example, in a three-bit-per-cell memory, the voltage window is divided into eight voltage bands: from $V_{MIN}$ to $V_{TH1}$, from $V_{TH1}$ to $V_{TH2}$, from $V_{TH2}$ to $V_{TH3}$, from $V_{TH3}$ to $V_{TH4}$, from $V_{TH4}$ to $V_{TH5}$, from $V_{TH5}$ to $V_{TH6}$, from $V_{TH6}$ to $V_{TH7}$ and from $V_{TH7}$ to $V_{MAX}$. $V_{TH1}$, $V_{TH2}$, etc. represent read reference levels which are also known as read threshold levels. threshold voltage within one of the voltage bands represents a bit pattern as shown in FIG. 1a: a threshold voltage between $V_{MIN}$ and $V_{TH1}$ represents the bit pattern "111", a threshold voltage between $V_{TH1}$ and $V_{TH2}$ represents the bit pattern "110", etc. In general, the voltage window of an m-bit-per-cell memory is divided into $2^m$ voltage bands. In this case, a three-bit Gray Code is used for the states so that a read error would cause one failed bit.

To read a flash cell, the threshold voltage of the flash cell is compared to the reference voltages that define the voltage bands. However, due to electromagnetic coupling between storage elements which can occur due to non-randomized data, as well as other effects, the threshold voltage distributions can change over time. Typically, the threshold voltage distributions widen in the direction of lower $V_{TH}$, and may overlap one another. As a result, read errors can occur.

Figure 1B:
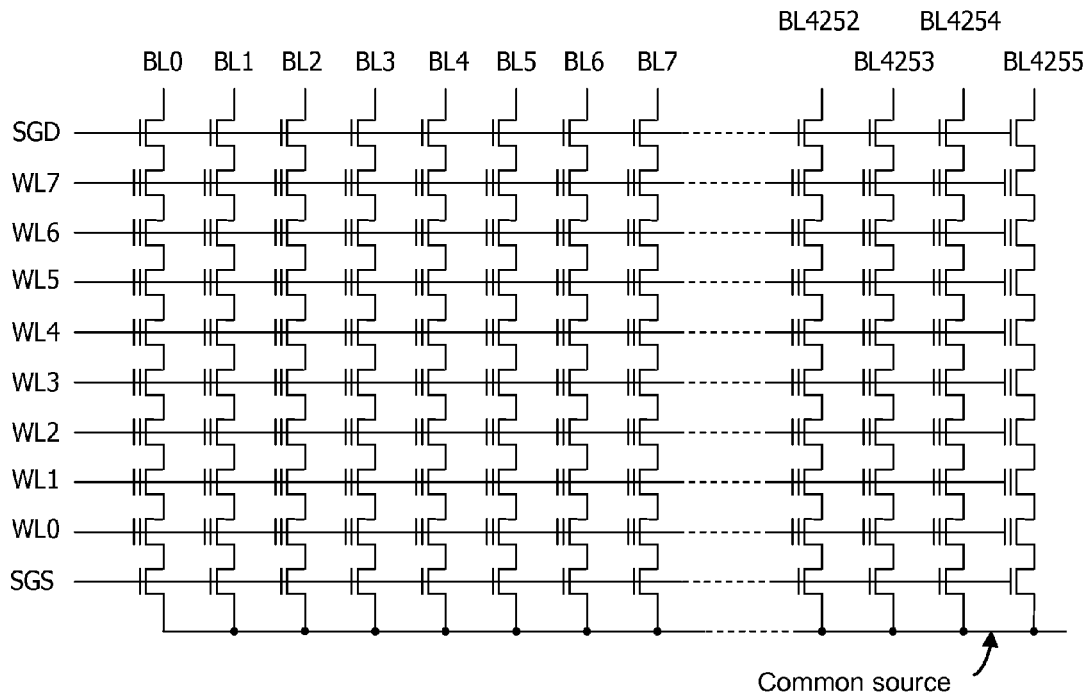
FIG. 1b depicts a block of storage elements.

FIG. 1b depicts a block of storage elements. In one example implementation, a NAND flash EEPROM can be partitioned into 1,024 blocks. The data stored in each block can be simultaneously erased. In one embodiment, the block is the minimum unit of storage elements that are simultaneously erased. In each block, in this example, there are 4,256 columns corresponding to bit lines BL0, BL1, . . . BL4255. In one embodiment referred to as an all bit line (ABL) architecture, all the bit lines of a block can be simultaneously selected during read and program operations, and storage elements along a common word line and connected to any bit line can be programmed at the same time.

In the example provided, eight storage elements are connected in series to form a NAND string, and there are eight data word lines WL0 through WL7. A NAND string can also include dummy storage elements and associated word lines. In other embodiments, the NAND strings can have more or less than eight data storage elements. Data memory cells can store user or system data. Dummy memory cells are typically not used to store user or system data.

One terminal of each NAND string is connected to a corresponding bit line via a drain select gate (connected to select gate drain line SGD), and another terminal is connected to a common source via a source select gate (connected to select gate source line SGS). Thus, the common source is coupled to each NAND string.

In one embodiment, referred to as an odd-even architecture, the bit lines are divided into even bit lines (BLe) and odd bit lines (BLo). In this case, storage elements along a common word line and connected to the odd bit lines are programmed at one time, while storage elements along a common word line and connected to even bit lines are programmed at another time. In each block, the columns are divided into even columns and odd columns.

During a read operation, the state of a storage element can thereby be detected by a voltage comparator sense amplifier that is connected to the bit line, in one possible implementation.

Scrambling

As mentioned at the outset, electromagnetic coupling between storage elements can increase the number of read errors. Such coupling can be reduced by randomizing the programmed data. Specifically, when programming data into a non-volatile memory device such as a NAND or NOR flash memory device, it is desirable that the programmed data appears to be random. Algorithms designed for reading the data, and in particular the read reference voltages for distinguishing the data states from one another, are developed under the assumption that the data programmed in the storage elements is random and exhibits no cross-correlation. Although, once the data is programmed, cross-correlation between the programmed values may appear due to the physical structure of the memory array itself. It is only desired that this is the case but there is no such specific assumption.

If, for example, a number of adjacent cells are programmed to the same state, e.g., state 7 (S7), which has the highest $V_{TH}$ of all states in an eight-state implementation, there will be a concentration of positive electric charge in the neighborhood of these storage elements which can result in a bias of the $V_{TH}$ levels in the neighboring cells due to electromagnetic coupling.

Therefore, prior to programming data, it is desirable to scramble the data by a pseudo random key, such that the data appears to be random. This requirement is similar to what is commonly done in communication channels. The algorithms and parameters for communication are designed for random data, and in order to ensure that the transmitted data appears random, the data is scrambled prior to transmission into the channel.

One major difference between classical communication scrambling and non-volatile memory scrambling lies in the fact that data transmitted on a communications channel is one dimensional, whereas a non-volatile memory device is multi-dimensional (at least two dimensions), so it is desirable to ensure that the scrambling operation generates random data in the multi-dimensional sense and, in practice, at least for each dimension separately. The two dimensions represent the rows (word lines) and columns (bit lines) of storage elements.

For example, sending the exact same data twice on a communications channel is not problematic (from the scrambler's perspective) as long as the data's length is longer than the channel response. However, programming the same data in two adjacent pages in a non-volatile memory array generates a high correlation along the bit lines, which may cause bit fails to occur.

As a note regarding terminology, in non-volatile memory, the basic unit for programming is sometimes referred to as a page, while pages are grouped into blocks. In other descriptions, the word line (WL) is used for the page, and a notion of bit line is defined to identify all the storage elements in a block which have the same relative position inside their word line (page). For example, a NAND string comprises storage elements on one bit line.

Legacy non-volatile devices had only one page, which included ones and zeros, and in each storage element either a '1' or '0' bit was programmed. Such devices are considered single bit per storage element devices. When non-volatile devices capable of storing more than one bit per storage element were introduced, a distinction between a logical page and a physical page became relevant. Such devices are considered multi bit per storage element devices.

The logical page is the same page that was employed for legacy single bit per storage element devices, while the physical page is equivalent to a word line. For example, each physical page or word line can include two logical pages for devices which are capable of storing two bits per storage element and, in a similar manner, each physical page or word line can includes three logical pages for non-volatile devices which are capable of storing three bits per storage element, and so forth.

Here, the terms page, block and bit line are employed to describe:
- page—An atomic unit for writing into the non-volatile memory, e.g., a physical page or word line (WL).
- block—An atomic unit for erasure in the non-volatile memory. A block contains multiple pages.
- bit line—storage elements within a block, each one from a different page, which have the same relative position in the pages to which they belong.

As mentioned, when data is written into a memory device, it is desirable that the data appears to be random in a multi-dimensional sense; in particular, that data along a page appears to be non-correlative and random with respect to data programmed to adjacent pages, e.g., data along the same bit line should appear to be non-correlative and random with respect to data programmed to storage elements in adjacent bit lines.

Also, data in different blocks with the same (or adjacent) position within the block, should appear to be non-correlative and random. For instance, data in a storage element at a fifth word line and a tenth bit line in one block should appear to be non-correlative and random with respect to data in a storage element at a fifth word line and a tenth bit line of another block. This requirement is not due to physical interference between blocks, which is typically negligible, but is motivated by the following scenario. Specifically, suppose scrambled data is programmed into the memory device, but due to specific parameters of the data, it is scrambled into a "bad" word-line, e.g., the storage elements with the scrambled data have correlations that affect the readability of the data, and cause interference to the data of adjacent storage elements.

The user will experience difficulties with the file associated with this "bad" data, therefore a natural course of operation from the user is that the user erases the file and rewrites it into the memory device again. Due to the requirement that data in two blocks should not be correlative, the scrambled re-written data is now completely different from the first corrupted scrambled data; consequently, the file is correctly read the second time.

One algorithm for scrambling data uses a pseudo-random number generator, such as a linear feedback shift register (LFSR) with a large number of bits, to generate a sequence of random bits, $X_i$. For any bit of incoming data $d_i$, we choose a random position in the block, optionally via another LFSR, and write ($X_i$ XOR $d_i$) in the random position. However, two problems exist with this solution:
1. In some non-volatile memory devices such as flash, due to practical reasons, a programming operation is restricted to be performed along the pages; therefore, the order in which data is programmed to the memory array is restricted, and cannot be chosen freely.
2. Recovering data requires performing multiple iterations on the pseudo-random-number-generator (possibly a LFSR) in order to recover the key used for scrambling (typically XORing) the data. In particular, to recover the data that was written last, one would have to run the full sequence of the pseudo-random number generator iterations until it reaches the last written data. However, data may be required by the user in a different order than it is written into the memory device.

Figure 1C:
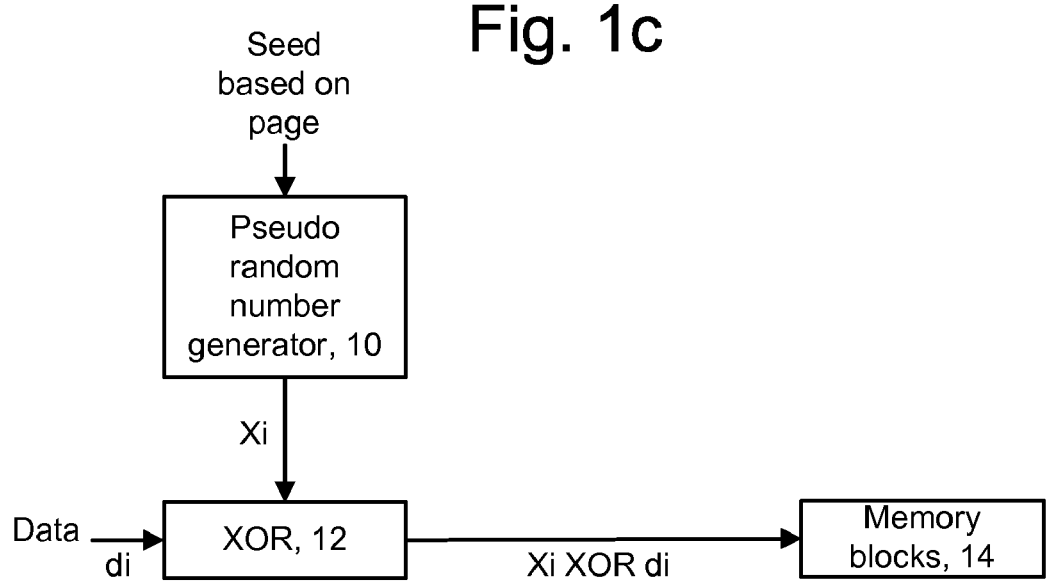
FIG. 1c depicts a system for scrambling data using a page-based pseudo-random number.

Another possible solution involves using a new seed for each page, which is a linear function of the page number or other identifier. Several options along this line are possible, the simplest one being to use the page number itself as a seed for a LFSR which is used to produce a pseudo-random-number sequence for scrambling of the page data. In this case, the LFSR uses the page number "n" as a seed for scrambling data into page n. This approach is illustrated in FIG. 1c, which depicts a system for scrambling data, such as user data, using a page-based pseudo-random number. An XOR function 12, receives the data bits di and the pseudorandom number bits Xi, and outputs Xi XOR di to memory blocks 14 of a memory array. Note that the use of an XOR function 12 is one possible example of logical operations which may be performed. AND, XOR and/or NOR operations may be performed, for instance. Another option is the use of a hash function.

The XOR function 12 may be considered to be a scrambler or encoder, where data scrambling is a form of encoding.

Figure 1D:
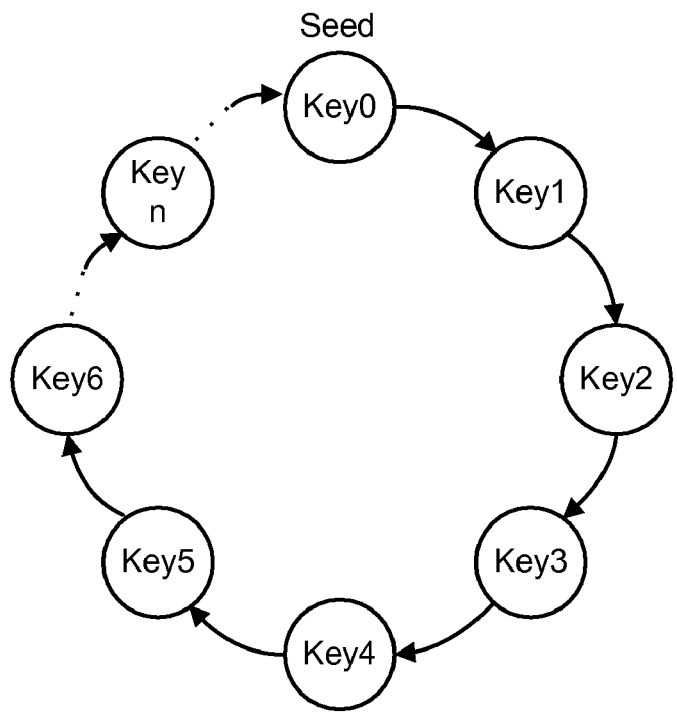
FIG. 1d depicts a key shift process.

The pseudo-random number bits Xi are provided by a pseudo-random number generator 10, responsive to a page-based seed. One example of a pseudo-random number generator 10 uses a key shift process, as described in FIG. 1d, in which an initial seed key, key0, is shifted n times to arrive at a key, key-n, for scrambling data into an nth page in the block. In one possible approach, the LFSR is used to implement a key shift. Here, an initial seed key, key0 is shifted in the shift register to generate successive keys which are used to scramble or descramble respective successive portions of user data. The key shift process may be either non-periodic or periodic with a very large period.

However, with this method, the data along the bit lines is not random enough, as correlations along the bit lines still exist. This is true when using n as a seed, and also when using other systematic functions of n as a seed for page n. A systematic function is meant to include a function that is based on some "nice" structure such as linear, square, exponential and other examples which can usually be expressed by a compact formula (unlike random or pseudo random functions which have no comprehensible structure).

Moreover, this solution uses the same scrambler for the same page in different blocks. Thus, if the same data happens to be written twice in the same page in two different blocks, there will be a high correlation between the blocks, so that if reading of one block fails, so does reading of the other block. A different option is to use an independent pseudo random number as a seed for each page.

This solution generates random data without correlations along the bit lines, or across blocks; however, a drawback is that it is required to store all the different seeds for all pages/word lines, in order to de-scramble the data when the data is read from the flash device, which consumes extra flash area. Another approach, discussed below, addresses the above-mentioned shortcoming.

One possible solution involves combining the two approaches mentioned above. In one possible embodiment, this involves, on one hand, using a systematic function of the page number to generate a seed, but on the other hand, adding more randomness into the process. This enables us to:
1. Easily generate and recover the seeds used for the different pages.
2. Generate pseudo random data with less correlation along the bit lines.
3. Use minimal additional memory for storing configuration parameters.

Figure 2A:
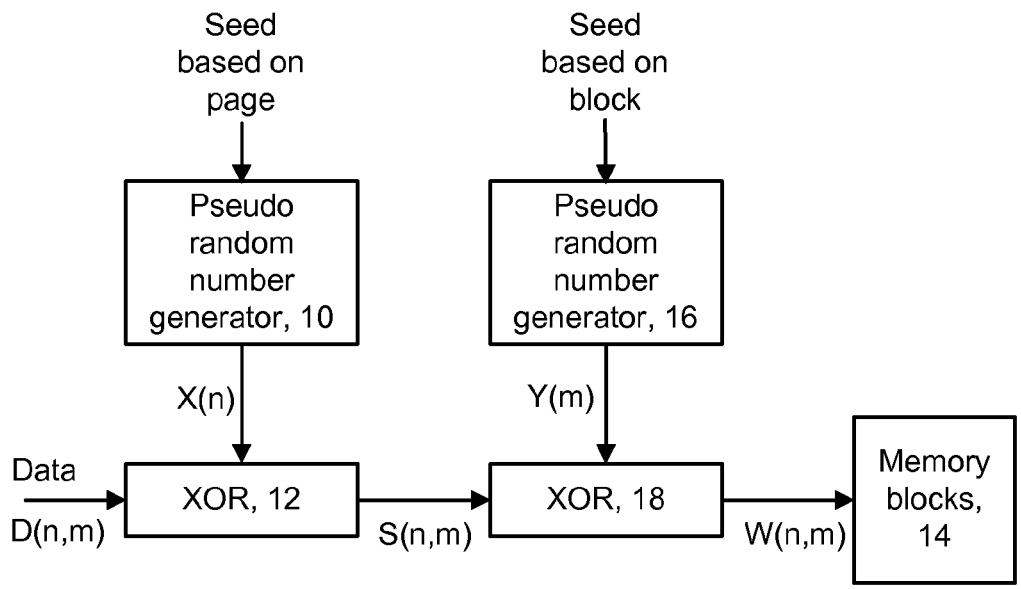
FIG. 2a depicts a scrambling system which uses a page-based pseudo-random number and a block-based pseudo-random number.
Figure 2B:
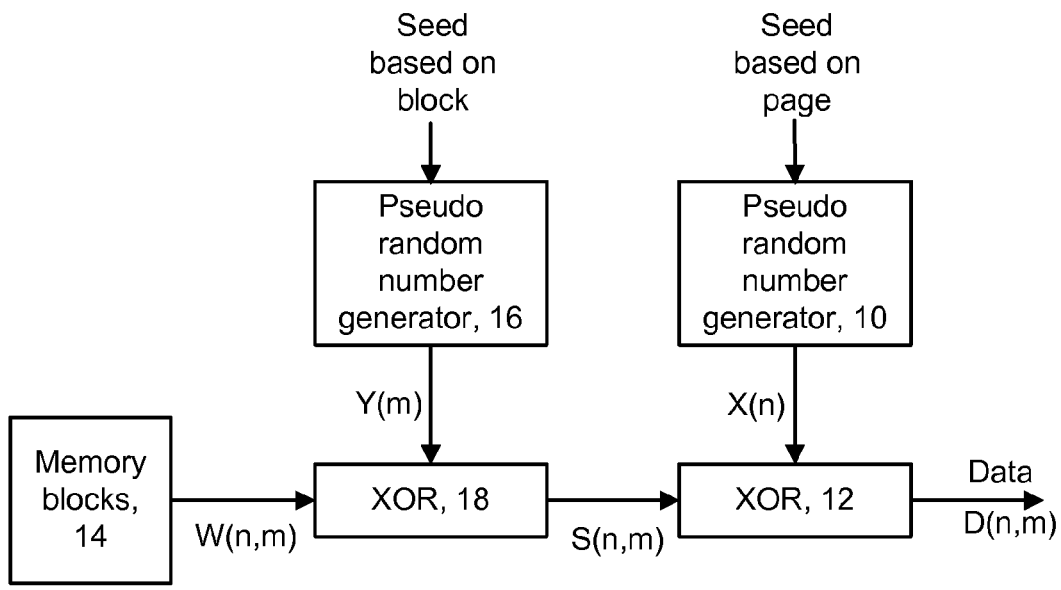
Figure 2C:
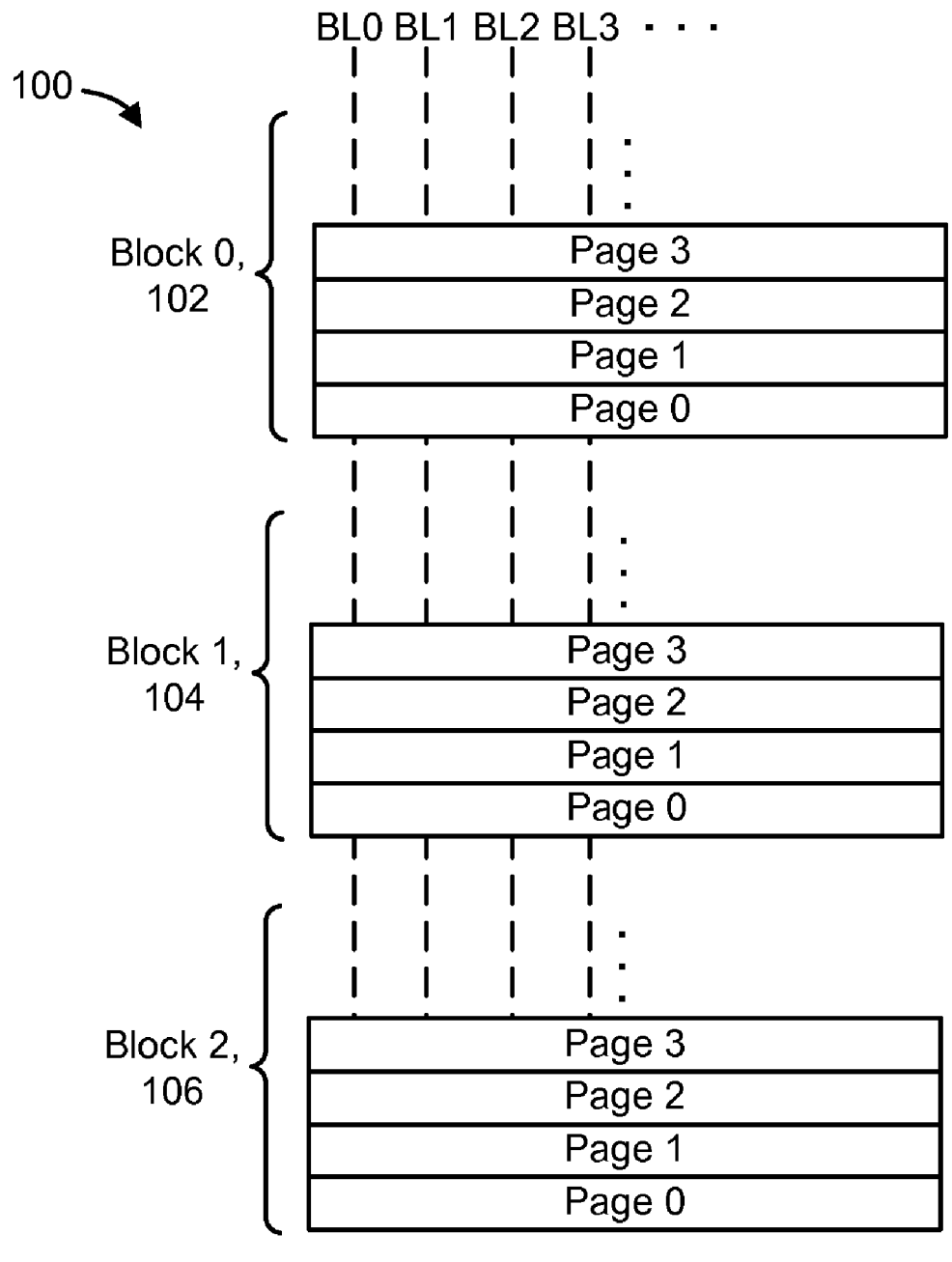
FIG. 2c depicts blocks and pages of a memory device.

An example algorithm for scrambling data into page n on block m is illustrated in FIG. 2a, which depicts a system for scrambling data using a page-based pseudo-random number and a block-based pseudo-random number. Refer also to FIG. 2c, which depicts blocks and pages of a memory device. In particular, a set of blocks 100 in a memory array includes block 0 (102), which includes pages 0, 1, 2 and 3, block 1 (104), which includes pages 0, 1, 2 and 3, and block 2 (106), which includes pages 0, 1, 2 and 3. Thus each page has a number or other identifier which is unique within a block, and each block has a block number or other identifier which is unique within a set of blocks such as in a memory array. In another possible approach, each page has a number or other identifier which is globally unique among the set of blocks. For example, in a simplified example in which there are four pages per block, block 0 may have pages numbered 0-3, block 1 may have pages numbered 4-7, block 2 may have pages numbered 8-11, and so forth.

This approach proceeds as follows:
1. Use a function of n to generate a first pseudo random number X(n), e.g., X as a function of n, using a first pseudo-random number generator 10 (FIG. 2a) which receives a first seed based on a page number of a page to which the data is to be written. The data D(n,m), e.g., D as a function of n and m, which is to be written into page n of block m is XOR-ed with X(n), at a first XOR block 12, on a bit by bit basis to generate pseudo random data S(n,m).
2. For block m, generate a second pseudo random number Y(m) using a second pseudo-random number generator 16 which receives a second seed based on a block number of a block to which the data is to be written. Then scramble S(n,m) with Y(m) at a second XOR block 18 to generate the pseudo random data W(n,m), which is written to page n of block m in the memory blocks 14.

One possible way to scramble data A of length k bits, is to generate a pseudo random number B of length k, and then produce the scrambled data C, also of length k, as: C=A XOR B. Or, as discussed, any type of logical operation may be used, including, e.g., AND, XOR and/or NOR. For example, data A may represent a page of data which contains k bits.

A can easily be recovered by XOR-ing again: A=C XOR B=(A XOR B) XOR B, or otherwise by performing the reverse of the logical operation used during scrambling. Specifically, referring to FIG. 2b, a descrambling system reads the data W(n,m) from the memory blocks 14, performs an XOR operation at the XOR block 18 using the pseudo-random number Y(m) to obtain the data S(n,m), and performs an additional XOR operation at the XOR block 12 using the pseudo-random number X(n) to obtain the descrambled data D(n,m). X(n) and Y(m) are generated from the pseudo-random generators 10 and 16 using a page-based seed and a block-based seed, respectively, as discussed.

The scrambling system of FIG. 2a is discussed further in connection with FIG. 2d, which depicts an example process in which data is scrambled based on a page number and then based on a block number. A program or write operation begins at step 200. Step 202 includes identifying a page n and a block m to which data D is to be written. For example, data D may be received by a memory device controller from a host device controller. This data may be referred to as original or particular data. The host controller may designate a page and block address for writing a page of data, for instance. Or, the memory device controller could determine the page and block address. Each page and block can be identified by an identifier such as a number, as discussed, e.g., in connection with FIG. 2c.

Referring still to FIG. 2d, step 204 includes generating a first pseudo-random number or bit sequence X(n), such as by using a pseudo-random number generator which receives the page number n as a seed. X(n) is optionally stored at a location from which it can be later retrieved during decoding, such as a working memory of a controller or the memory array. This approach avoids the need to re-generate X(n) during decoding although additional memory is consumed. Step 206 includes scrambling the data D using X(n) to provide first scrambled data or bit sequence S(n,m). Step 208 includes generating a second pseudo-random number or bit sequence Y(m), such as by using a pseudo-random number generator which receives the block number m as a seed. Y(m) is optionally stored at a location from which it can be later retrieved during decoding.

Step 210 includes scrambling S(n,m) using Y(m) to provide second scrambled data or bit sequence W(n,m). Step 212 includes writing W(n,m) to block m, page n. At decision step 214, if the programming is completed, the process ends at step 216. If the process is not completed, a page and block of additional data to be written is identified at step 202 and the process repeats as described to scramble and write the additional data.

FIG. 2e depicts an example descrambling process which is a counterpart of the scrambling process of FIG. 2d. A read operation repeats many of the steps of the associated write process, although in a somewhat reverse order. An example read operation begins at step 220. Step 222 includes identifying a page n and a block m in the memory array from which data D is to be read. For example, a request to read data D may be received by a memory device controller from a host device controller. The host controller may designate the page and block address for reading a page of data, for instance. Or, the memory device controller could determine the page and block address. Step 224 includes reading the second scrambled data W(n,m) from block m, page n. Optionally, Y(m) is directly retrieved at step 227 from a location at which it was previously stored and used for descrambling at step 228. Also, optionally, X(n) is directly retrieved at step 231 from a location at which it was previously stored and used for descrambling at step 232.

Steps 226, 228 and 230 correspond to steps 204, 206 and 208, respectively. Step 232 includes descrambling S(n,m) using X(n) to provide the descrambled data D. At decision step 234, if the reading is completed, the process ends at step 236. If the process is not completed, a page and block of additional data to be read is identified at step 222 and the process repeats as described to read and descramble the additional data.

In the above examples, an XOR logical operation was depicted. Some basic properties of XOR to be noted are:
1. Commutative: A XOR B=B XOR A
2. Associative: (A XOR B) XOR C=A XOR (B XOR C)
3. Neutrality: (A XOR 0)=A
4. B XOR B=0.

Therefore, all the different orders in which scrambling, based on two (or more) independent XOR operations may be implemented, are considered. For example, while page-based scrambling preceded block-based scrambling in the above-mentioned example, it is alternatively possible for block-based scrambling to precede page-based scrambling, as described next.

When other logical operations are used, the four properties above may not hold true.

FIG. 2f depicts an example process in which data is scrambled based on a block number and then based on a page number. A program or write operation begins at step 240. Step 242 includes identifying a page n and a block m to which data D is to be written. Step 244 includes generating a first pseudo-random number Y(m), such as by using a pseudo-random number generator which receives the block number m as a seed. Y(m) is optionally stored at a location from which it can be later retrieved during decoding. Step 246 includes scrambling the data D using Y(m) to provide first scrambled data S(n,m). Step 248 includes generating a second pseudo-random number X(n), such as by using a pseudo-random number generator which receives the page number n as a seed. X(n) is optionally stored at a location from which it can be later retrieved during decoding. Step 250 includes scrambling S(n, m) using X(n) to provide second scrambled data W(n,m). Step 252 includes writing W(n,m) to block m, page n. At decision step 254, if the programming is completed, the process ends at step 256. If the process is not completed, a page and block of additional data to be written is identified at step 242 and the process repeats as described to scramble and write the additional data.

A corresponding scrambling system can be based on FIG. 2a but with Y(m) being XORed before X(n).

FIG. 2g depicts an example descrambling process which is a counterpart of the scrambling process of FIG. 2f. A read operation begins at step 260. Step 262 includes identifying a page n and a block m in the memory array from which data D is to be read. Step 264 includes reading the second scrambled data W(n,m) from block m, page n. Optionally, X(n) is directly retrieved at step 267 from a location at which it was previously stored and used for descrambling at step 268. Optionally, Y(m) is directly retrieved at step 271 from a location at which it was previously stored and used for descrambling at step 272.

Step 266 includes generating second pseudo random data X(n) based on page n. Step 268 includes descrambling W(n, m) using X(n) to provide first scrambled data S(n,m). Step 270 includes generating first pseudo random data Y(m) based on block m. Step 272 includes descrambling S(n,m) using Y(m) to provide the descrambled data D. At decision step 274, if the reading is completed, the process ends at step 276. If the process is not completed, a page and block of additional data to be read is identified at step 262 and the process repeats as described to read and descramble the additional data. A corresponding descrambling system can be based on FIG. 2b but with X(n) being XORed before Y(m).

As mentioned, scrambling based on an XOR operation is just one option for scrambling, and other options, which comply with the requirements, may be candidates for a scrambling operation.

Generally, the scrambling and descrambling can depend linearly or non-linearly on a page, block and/or section. Non-linear operations can include a modulo operation or finite field multiplication defined in a finite field. Further, it is possible to replace the use of a pseudo-random number with a random number.

Another aspect involves generating a scrambling key for scrambling data based on two or more page and/or block based scrambling keys. In the following example, we denote the data scrambled by "A," the first pseudo-random number by "B," (the one dependent on the page number), and the second pseudo-random number by "C," (the one dependent on the block number). In one approach, regarding the associative property, (A XOR B) XOR C can be replaced by (A XOR C) XOR B. Also, (A XOR B) XOR C can be replaced by A XOR (B XOR C), i.e., first the pseudo-random number B is XOR-ed to form a new pseudo-random number (B XOR C) (a new scrambling key is generated from two existing scrambling keys). More generally, A is scrambled with any function of the numbers B and C, not only A XOR (B XOR C). One possible implementation is described as follows.

Figure 3A:
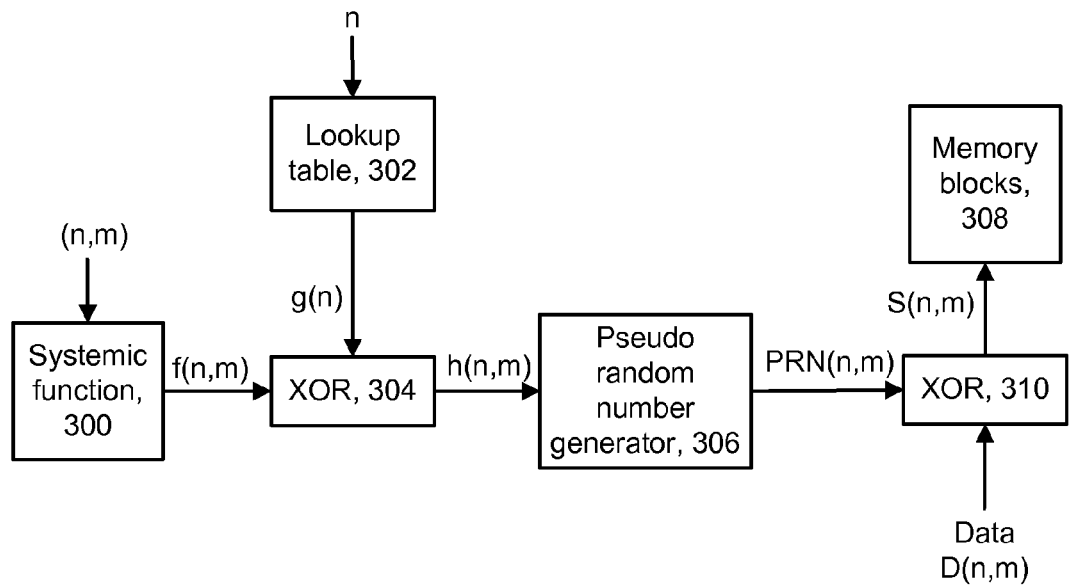
FIG. 3a depicts a scrambling system in which data is scrambled based on a page- and block-based pseudo-random number.

Referring to the scrambling system of FIG. 3a, for each page n in block m, two relatively small numbers are chosen (much smaller than the random number of length k mentioned above). For example, the two small numbers may be represented by at most sixteen bits, i.e., they represent a number whose value is at most $2^{16}$. As described below, they will be used to generate a number h(n,m), which will also be represented by at most sixteen bits, and h(n,m) will be used as a seed to a pseudo-random number generator. The pseudo-random number generator will generate a bit sequence of length k, where k is the length of the data we want to scramble. For instance, k may be 1000 or more bits, so the value represented by the bit sequence of k bits is of the order of magnitude of $2^{1000}$ or more, which is a few orders of magnitude larger than h(n,m). Note, however, that for the scrambling process itself, we use the bit sequences, not the value of the number represented by the bit sequence. From a storage perspective, we have to store only the sixteen bit representation of the small numbers, while the long (1000 or more) bits used for scrambling are generated online and there is no need to store them. However, this is an example only as other bit lengths may be used.

The first number, also referred to as a bit sequence, is a systematic function of both n and m, which is output from a system function block 300. For example, it can be the page number in the memory device, e.g., a unique page number, which may be expressed as: $f(n,m)=2^R m+n$, where R is the number of bits required to represent the number of pages in a block ($R=\log_2[\#\text{pages in a block}]$). The systematic function can be linear or non-linear.

For example, assuming two pages per word line and sixty four word lines per block, we have 128 pages per block, and $R=\log_2(128)=7$ bits. For example, with a third block (m=3), and an $n=10^{th}$ page in the third block, the systematic function or bit sequence is thus $f(n,m)=2^7 \times 3+10=128 \times 3+10=394$. Thus, we can obtain a unique page number f(n,m) which is unique among a set of blocks in a memory array, or a local page number n which is unique within a given block but is repeated in different blocks of a memory array.

The second number or bit sequence, denoted g(n), is chosen from a predefined set of $2^R$ independently chosen pseudo random numbers (one for each page within a block). This predefined set can be stored in a lookup table 302 of the memory device, for instance, indexed by page. A lookup table can be stored in the memory array or in separate memory of the controller, for instance. The two numbers f(n,m) and g(n) are XOR-ed, at an XOR block 304, to generate a bit sequence h(n,m)=f(n,m) XOR g(n). Then, h(n,m) is used as a seed for a pseudo-random number generator 306, typically a LFSR-based generator, while repeated iterations of the LFSR generate the pseudo-random number or bit sequence PRN(n,m) of length k mentioned above. The data to be written is scrambled by PRN(n,m), such as at an XOR block 310, to produce the scrambled data S(n,m) which is written to block m, page n of the memory blocks 308.

Figure 3B:
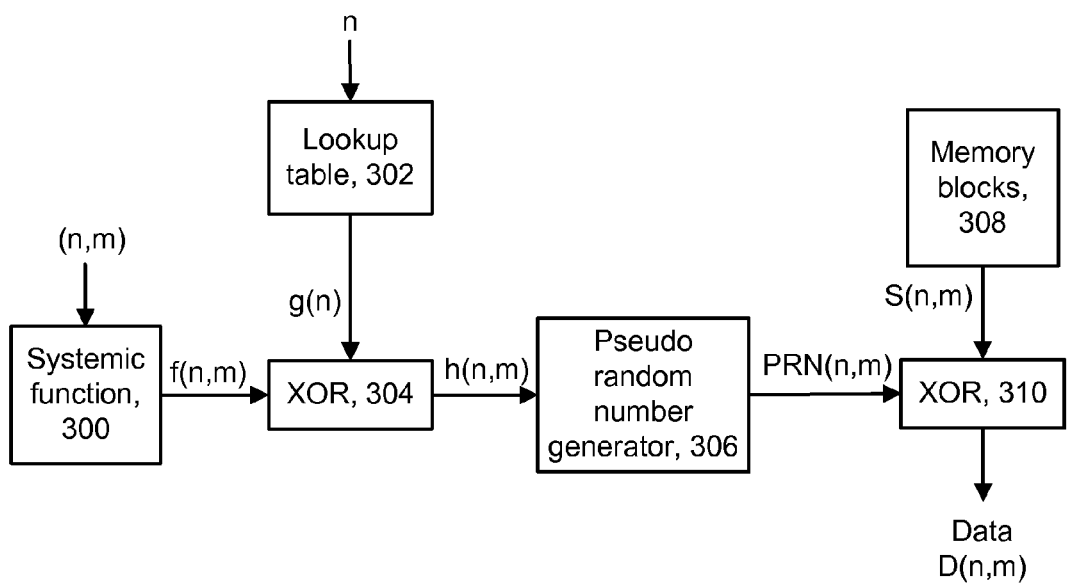

A corresponding descrambling system is depicted at FIG. 3b, which is a counterpart of the scrambling system of FIG. 3a. Here, the scrambled data S(n,m) is read from block m, page n of the memory blocks 308 and descrambled at the XOR block 310 to produce the descrambled data D(n,m). Again, the use of XOR blocks is an example only as other logical operations may be used.

In order to make sure the seeds for different word lines are different from one another, an additional requirement may be introduced on f(n,m) and g(n): the value g(n) is generated to be slightly longer (by at least R bits) than f(n,m). These additional bits are required to generate $2^R$ different numbers, and this deterministically assures that if (n1,m1)≠(n2,m2) then also h(n1,m1)≠h(n2,m2).

Therefore, if specific data that together with the scrambling produces a bad pattern in one page/word line of one block, then when copied to another page/word line, the bad pattern does not appear any more. This is an important restriction which may be imposed on the scrambling mechanism. Otherwise, a scenario may exist in which the memory device cannot hold a specific data pattern at all.

A program operation which corresponds to the scrambling system of FIG. 3a is provided at FIG. 3c. The program operation begins at step 320. Step 322 includes identifying a page n and a block m to which data D is to be written. Step 324 includes generating a first (systemic) number f(n,m). Step 326 includes generating a second (pseudo-random) number g(n). Step 328 includes generating a third (pseudo-random) number h(n,m) from f(n,m) and g(n). Step 330 includes generating a fourth (pseudo-random) number PRN(n,m) using h(n,m) as a seed to a pseudo-random number generator. Step 332 includes scrambling the data D using PRN(n,m) to provide scrambled data S(n,m). PRN(n,m) is optionally stored at a location from which it can be later retrieved during decoding. Step 334 includes writing S(n,m) to block m, page n. At decision step 336, if the programming is completed, the process ends at step 338. If the process is not completed, a page and block of additional data to be written is identified at step 322 and the process repeats as described to scramble and write the additional data.

A read operation which is the counterpart of the program operation of FIG. 3c, and which corresponds to the descrambling system of FIG. 3b, is provided at FIG. 3d. The read operation begins at step 340. Step 342 includes identifying a page n and a block m to which data D is to be written. Step 344 includes reading the scrambled data S(n,m) from block m, page n of the memory array. Optionally, PRN(n,m) is directly retrieved at step 353 from a location at which it was previously stored and used for descrambling at step 354.

Steps 346, 348, 350 and 352 correspond to steps 324, 326, 328 and 330, respectively. Step 354 includes descrambling the data S(n,m) using PRN(n,m) to provide descrambled data D(n,m). At decision step 356, if the reading is completed, the process ends at step 358. If the process is not completed, a page and block of additional data to be read is identified at step 342 and the process repeats as described to read and descramble the additional data.

Figure 4A:
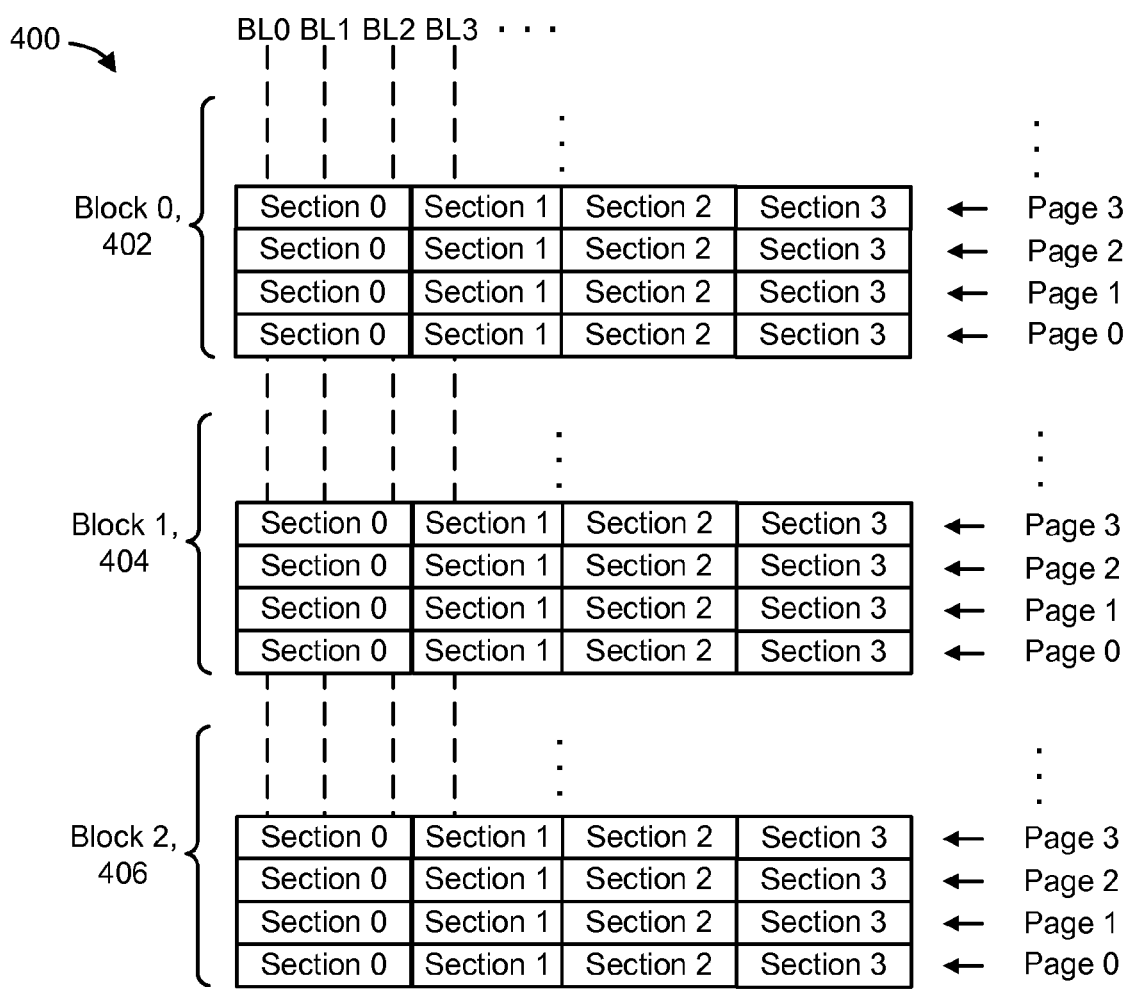
FIG. 4a depicts blocks, pages and sections of a memory device.

In another embodiment. each page of the memory device is divided into S sections. These sections are typically cells (storage elements) corresponding to groups of bit lines. See FIG. 4a, which depicts blocks, pages and sections of a memory device. In this example, three sections are used for each page. In particular, a set of blocks 400 in a memory array includes block 0 (402), which includes pages 0, 1, 2 and 3, block 1 (404), which includes pages 0, 1, 2 and 3 and block 2 (406), which includes pages 0, 1, 2 and 3. Moreover, each page includes four sections, section 0, section 1, section 2 and section 3.

For each triplet of (page n, section s, and block m), two relatively small numbers (much smaller than the random number of length k mentioned above) are chosen. The first number, denoted f(n,s,m) is a systematic function of n, s and m. The second number, denoted g(n), is chosen from a predefined set of $2^R$ independently chosen pseudo random numbers (one for each page within a block). This predefined set can be stored in a lookup table of the memory device, for instance, indexed by page. For example, as discussed previously, the two small numbers may be represented by at most sixteen bits, and they are used to generate a number h(n,s,m), which will also be represented by at most sixteen bits, and h(n,s,m) will be used as a seed to a pseudo-random number generator.

The two numbers f(n,s,m) and g(n) are XOR-ed to generate h(n,s,m)=f(n,s,m) XOR g(n). Then, h(n,s,m) is used as a seed for a pseudo-random number generator LFSR, and repeated iterations of the LFSR generate the pseudo-random number or scrambling key of length k mentioned above. The scrambling key can also be a function of a section number (bit line or bit line group) within the page/word line. This approach can be implemented in the scrambling system of FIG. 4b, which corresponds to FIG. 3a, except the systemic function 400 is a function of (n,s,m) rather than (n,m). In this case, the output from the system function 400 is f(n,s,m), the output from the XOR 304 is h(n,s,m), the output from pseudo-random number generator 306 is PRN(n,s,m), the unscrambled data D to be written is D(n,s,m) and the scrambled data S to be written is S(n,s,m). A counterpart descrambling system is depicted in FIG. 4c, which corresponds to FIG. 3b, except the systemic function 400 is a function of (n,s,m) rather than (n,m). Here, the scrambled data S to be read is S(n,s,m) and the descrambled data D to be read is D(n,s,m).

Figure 4B:
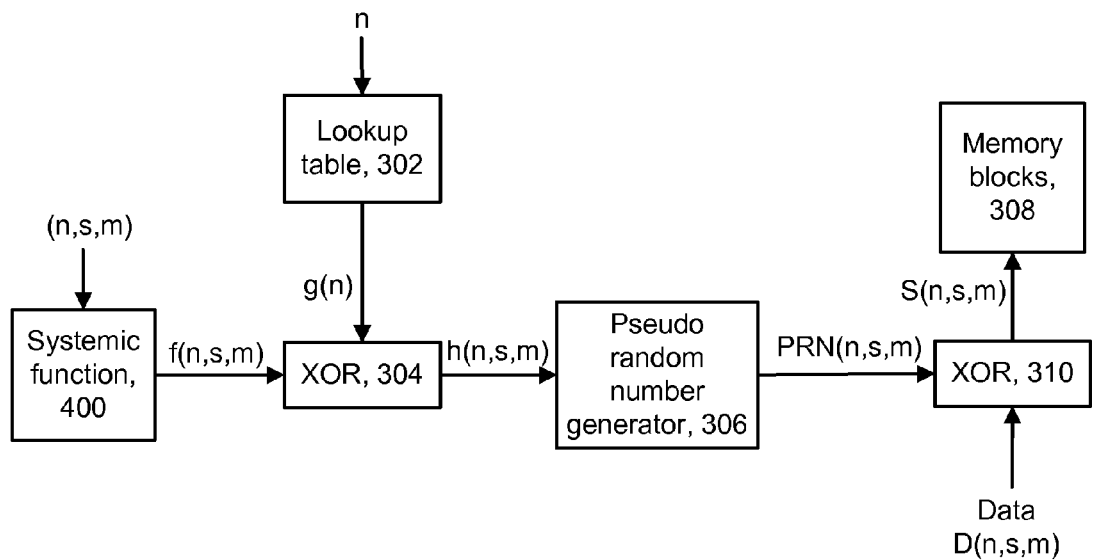
FIG. 4b depicts a scrambling system in which data is scrambled based on a page-, section- and block-based pseudo-random number.
Figure 4C:
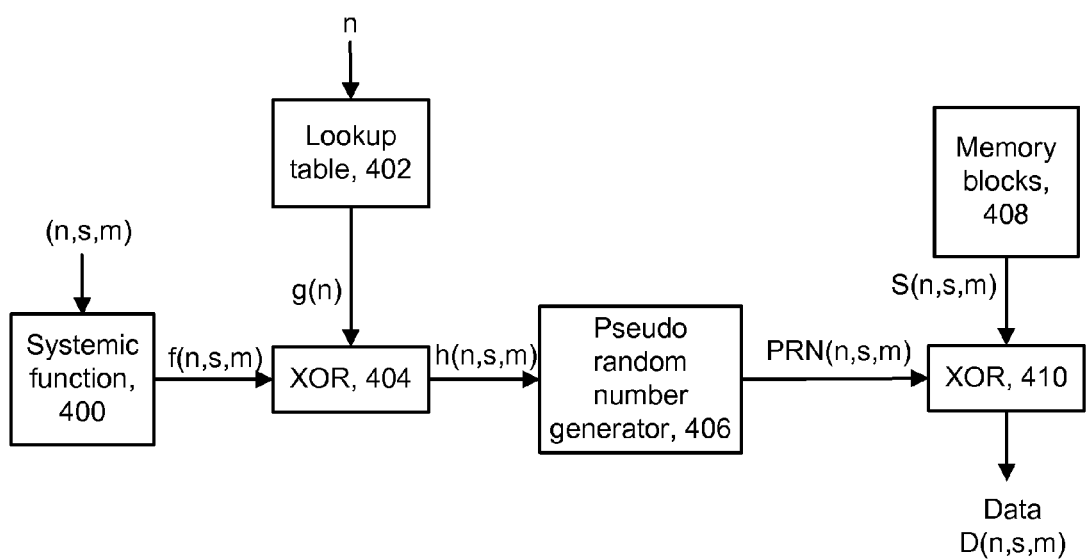
FIG. 4c depicts a descrambling system which is a counterpart of FIG. 4b.

A corresponding program operation is provided at FIG. 4d, based on the scrambling system of FIG. 4b. The program operation begins at step 430. Step 432 includes identifying a page n, section s and a block m to which data D is to be written. Step 434 includes generating a first (systemic) number f(n,s,m). Step 436 includes generating a second (pseudo-random) number g(n). Step 438 includes generating a third (pseudo-random) number h(n,s,m) from f(n,s,m) and g(n). Step 440 includes generating a fourth (pseudo-random) number PRN(n,s,m) using h(n,m) as a seed to a pseudo-random number generator. PRN(n,s,m) is optionally stored at a location from which it can be later retrieved during decoding. Step 442 includes scrambling the data D using PRN(n,s,m) to provide scrambled data S(n,s,m). Step 444 includes writing S(n,s,m) to block m, page n, section s. At decision step 446, if the programming is completed, the process ends at step 448. If the process is not completed, a page, section and block of additional data to be written is identified at step 432 and the process repeats as described to scramble and write the additional data.

A read operation which is the counterpart of the program operation of FIG. 4d, and which is based on the descrambling system of FIG. 4c, is provided in FIG. 4e. The read operation begins at step 450. Step 452 includes identifying a page n, section s and a block m to which data D is to be written. Step 454 includes reading the scrambled data S(n,s,m) from block m, page n, section s of the memory array. Optionally, PRN(n,s,m) is directly retrieved at step 463 from a location at which it was previously stored and used for descrambling at step 464.

Steps 456, 458, 460 and 462 correspond to steps 434, 436, 438 and 440, respectively, of FIG. 4d. Step 464 includes descrambling the data S(n,s,m) using PRN(n,s,m) to provide descrambled data D(n,s,m). At decision step 466, if the reading is completed, the process ends at step 468. If the process is not completed, a page, section and block of additional data to be read is identified at step 452 and the process repeats as described to read and descramble the additional data.

Yet another embodiment is a variation on the previous embodiment. This approach can be implemented by the scrambling system of FIG. 5a, which differs from FIG. 3a in that two lookup tables 502 and 504 are used. For each triplet of (page n, section s, and block m), three relatively small numbers (much smaller than the random number of length k mentioned above) are chosen. The first number, denoted f(n, m) is output from the system function 500 as a systematic function of n and m. The second number, denoted g(n), is chosen from a predefined set of $2^R$ independently chosen pseudo random numbers (one for each page within a block). This predefined set can be stored in the lookup table 502 of the memory device, for instance, indexed by page. The third number, u(s), is chosen from a predefined set of $2^Q$ independently chosen pseudo random numbers (one for each section within a page), such that $Q=\log_2[s]$. This predefined set can be stored in the lookup table 504 of the memory device, for instance, indexed by section/bit line group.

The three numbers f(n,m), g(n) and u(s) are XOR-ed at XOR block 506 to generate h(n,s,m)=f(n,m) XOR g(n) XOR u(s). Then, h(n,s,m) is used as a seed for a pseudo-random number generator 508 typically based on a LFSR, and repeated iterations of the LFSR generate the pseudo-random number PRN(n,s,m) of length k mentioned above. The data to be written is scrambled by PRN(n,s,m) such as at the XOR block 512 to produce the scrambled data S(n,s,m) which is written to block m, page n, section s of the memory blocks 510.

Figure 5A:
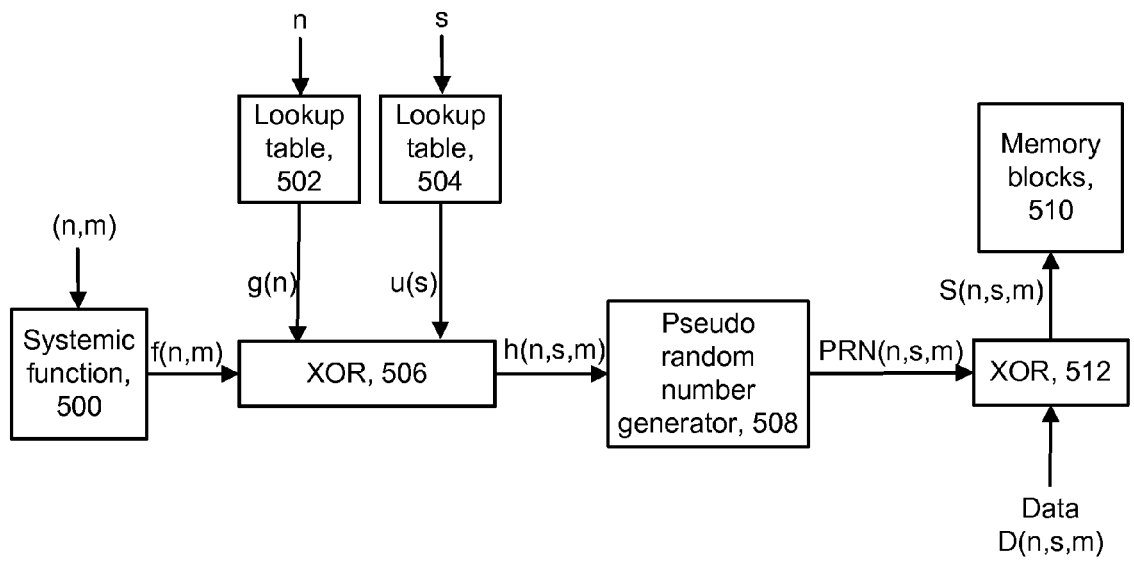
FIG. 5a depicts an alternative scrambling system in which data is scrambled based on a page-, section- and block-based pseudo-random number.
Figure 5B:
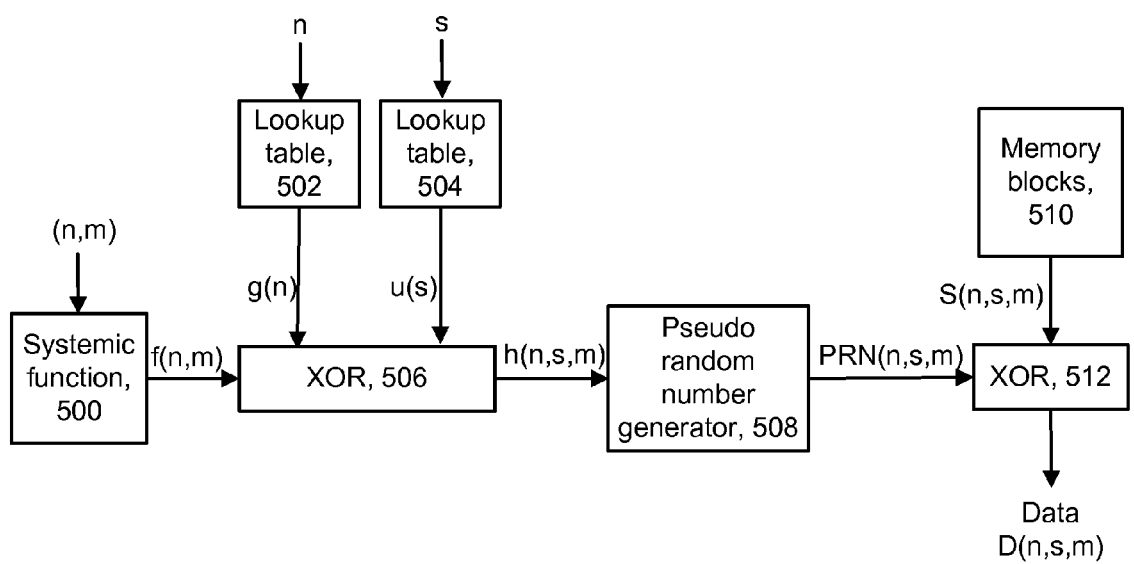

The corresponding descrambling system is depicted at FIG. 5*b*, as a counterpart of the scrambling system of FIG. 5*a*, where the scrambled data S(n,s,m) is read from block m, page n, section s of the memory blocks 510 and descrambled at the XOR block 512 to produce the descrambled data D(n,s,m).

A corresponding program operation is provided at FIG. 5*c*, based on the scrambling system of FIG. 5*a*. The program operation begins at step 520. Step 522 includes identifying a page n, section s and a block m to which data D is to be written. Step 524 includes generating a first (systemic) number f(n,m). Step 526 includes generating a second (pseudo-random) number g(n). Step 528 includes choosing a third (pseudo-random) number u(s) based on the section number s. Step 530 includes generating a fourth (pseudo-random) number h(n,s,m) from f(n,s,m) and g(n). Step 532 includes generating a fifth (pseudo-random) number PRN(n,s,m) using h(n,s,m) as a seed to a pseudo-random number generator. PRN(n,m) is optionally stored at a location from which it can be later retrieved during decoding.

Step 534 includes scrambling the data D using PRN(n,s,m) to provide scrambled data S(n,s,m). Step 536 includes writing S(n,s,m) to block m, page n, section s. At decision step 528, if the programming is completed, the process ends at step 540. If the process is not completed, a page, section and block of additional data to be written is identified at step 522 and the process repeats as described to scramble and write the additional data.

A read operation which is the counterpart of the program operation of FIG. 5*c*, and is based on the descrambling system of FIG. 5*b*, is provided at FIG. 5*d*. The read operation begins at step 550. Step 552 includes identifying a page n, section s and a block m to which data D is to be written. Step 554 includes reading the scrambled data S(n,s,m) from block m, page n, section s of the memory array. Optionally, PRN(n,m) is directly retrieved at step 565 from a location at which it was previously stored and used for descrambling at step 566.

Steps 556, 558, 560, 562 and 564 correspond to steps 524, 526, 528, 530 and 532, respectively, of FIG. 5*c*. Step 566 includes descrambling the data S(n,s,m) using PRN(n,s,m) to provide descrambled data D(n,s,m). At decision step 568, if the reading is completed, the process ends at step 570. If the process is not completed, a page, section and block of additional data to be read is identified at step 552, and the process repeats as described to read and descramble the additional data.

Another possible approach involves generating a scrambling key for a page as a function of scrambling keys generated for one or more previous pages and/or blocks.

In one example approach, scrambling is based on current and prior page numbers, but not necessarily a block number. For example, in FIG. 6*a*, a program operation begins at step 600. Step 602 includes identifying a page n to which data D is to be written. Step 604 includes retrieving a previously generated first pseudo-random number X(n-1) which is associated with a prior page n-1. Step 606 includes generating and storing a new pseudo-random number X(n) using X(n-1) as a seed to a first pseudo-random number generator. X(n) can be stored in a memory of the controller or in the memory blocks. Step 608 includes generating a number PRN(n) using X(n) as a seed to a second pseudo-random number generator. Optionally, PRN(n) is stored in a location from which it can later be directly retrieved during decoding, such as a memory of the controller. However, this requires storing a larger number than X(n-1). Step 610 includes scrambling the data D using PRN(n) to provide scrambled data. Pseudo-random numbers or other scrambling data associated with one or more prior pages or other units of data may be stored and retrieved. The first and second pseudo-random number generators should be chosen such that the probability that the correlation between the PRN(n) and PRN(j), (where j<n), exceeds a predefined correlation value is less than a predefined probability value. By the correlation between PRN(n) and PRN(j), we mean the correlation between the bit-sequence representation of PRN(n) and the bit-sequence representation of PRN(j).

Moreover, it possible to provide scrambling keys PRN(n) and PRN(n-1) so that they are strongly uncorrelated. For example, the scrambling keys can be selected so that a probability that a correlation between them exceeds a predefined correlation value is less than a predefined probability value.

The scrambling keys PRN(n) are determined by the two pseudo-random numbers generators and the first seed X(1). The exact parameters may be selected from offline simulations comparing various choices of the parameters.

Step 612 includes writing S(n) to page n of some block. At decision step 614, if the programming is completed, the process ends at step 616. If the process is not completed, a page of additional data to be written is identified at step 602 and the process repeats as described to scramble and write the additional data. The process can be modified accordingly to include previously generated pseudo-random numbers or other scrambling or encoding data X(n-2), X(n-3), . . . which are associated with prior pages n-2, n-3, respectively, and so forth.

A corresponding descrambling process, provided in FIG. 6*b*, includes beginning a read operation at step 620. Step 622 includes identifying a page n and a block m in the memory array from which data D is to be read. Step 624 includes reading the scrambled data S(n) from page n of some block. Optionally, at step 631, PRN(n) is directly retrieved from a location at which it was previously stored, and descrambling is performed at step 632. Otherwise, steps 626, 628 and 630 correspond to steps 604, 606 and 608, respectively. Step 632 includes descrambling S(n) using PRN(n) to provide the descrambled data D. For example, D and PRN(n) may be provided to an XOR function. At decision step 634, if the reading is completed, the process ends at step 636. If the process is not completed, a page of some block of additional data to be read is identified at step 622 and the process repeats as described to read and descramble the additional data.

In another example approach, scrambling is based on current and prior page numbers, and on a current block number. For example, in FIG. 6*c*, a program operation begins at step 640. Step 642 includes identifying a page n and a block m to which data D is to be written. Step 644 includes retrieving a previously generated first pseudo-random number X(n-1) which is associated with a prior page n-1. Step 646 includes generating and storing a second pseudo-random number X(n) using X(n-1) as a seed. Step 648 includes generating a third pseudo-random number PRN(n) using X(n) as a seed. Step 650 includes scrambling the data D using PRN(n) to provide first scrambled data S(n). Step 652 includes generating a fourth pseudo-random number Y(m). Step 654 includes scrambling S(n) using Y(m) to provide second scrambled data W(n,m). Step 656 includes writing W(n,m) to block m, page n. At decision step 658, if the programming is completed, the process ends at step 659. If the process is not completed, a page and block of additional data to be written is identified at step 642 and the process repeats as described to scramble and write the additional data.

A corresponding descrambling process, provided in FIG. 6d, includes beginning a read operation at step 660. Step 661 includes identifying a page n and a block m in the memory array from which data D is to be read. Step 662 includes reading the second scrambled data W(n,m) from block m, page n. Optionally, at step 664, Y(m) is directly retrieved from a location at which it was previously stored, and used for descrambling at step 665. Also, optionally, at step 669, PRN(n) is directly retrieved from a location at which it was previously stored, and used for descrambling at step 670.

Step 663 includes generating the fourth pseudo-random number Y(m) based on block m. Step 665 includes descrambling W(n,m) using Y(m) to provide the first scrambled data S(n). Steps 666, 667 and 668 correspond to steps 644, 646 and 648, respectively, of FIG. 6c. Step 670 includes descrambling S(n,m) using PRN(n) to provide descrambled data D. At decision step 671, if the reading is completed, the process ends at step 672. If the process is not completed, a page and block of additional data to be read is identified at step 661 and the process repeats as described to read and descramble the additional data.

In another example approach, scrambling is based on current and prior block numbers, and on a current page number. For example, in FIG. 6e, a program operation begins at step 680. Step 681 includes identifying a page n and a block m to which data D is to be written. Step 682 includes generating a first pseudo-random number X(n). Optionally, X(n) is stored for retrieval during decoding. Step 683 includes scrambling the data D using X(n) to provide first scrambled data S(n). Step 684 includes retrieving a previously generated second pseudo-random number Y(m-1) which is associated with a prior block m-1. Step 685 includes generating and storing a third pseudo-random number Y(m) using Y(m-1) as a seed. Step 686 includes generating a fourth pseudo-random number PRN(m) using Y(m) as a seed. Optionally, PRN(m) is stored for retrieval during decoding. Step 687 includes scrambling S(n) using PRN(m) to provide second scrambled data W(n,m). Step 688 includes writing W(n,m) to block m, page n. At decision step 689, if the programming is completed, the process ends at step 690. If the process is not completed, a page and block of additional data to be written is identified at step 681 and the process repeats as described to scramble and write the additional data.

A corresponding descrambling process, provided in FIG. 6f, includes beginning a read operation at step 691. Step 692 includes identifying a page n and a block m in the memory array from which data D is to be read. Step 693 includes reading the second scrambled data W(n,m) from block m, page n. Optionally, PRN(m) is retrieved at step 697 and used for descrambling at step 698. Also, optionally, X(n) is retrieved at step 700 and used for descrambling at step 701.

Steps 694, 695, nd 696 correspond to steps 684, 685 and 686, respectively, of FIG. 6e. Step 698 includes descrambling W(n,m) using PRN(m) to provide the first scrambled data S(n). Step 699 includes generating the first pseudo-random number X(n). Step 701 includes descrambling S(n) using X(n) to provide descrambled data D. At decision step 702, if the reading is completed, the process ends at step 703. If the process is not completed, a page and block of additional data to be read is identified at step 692 and the process repeats as described to read and descramble the additional data. Other variations are possible.

Figure 7:
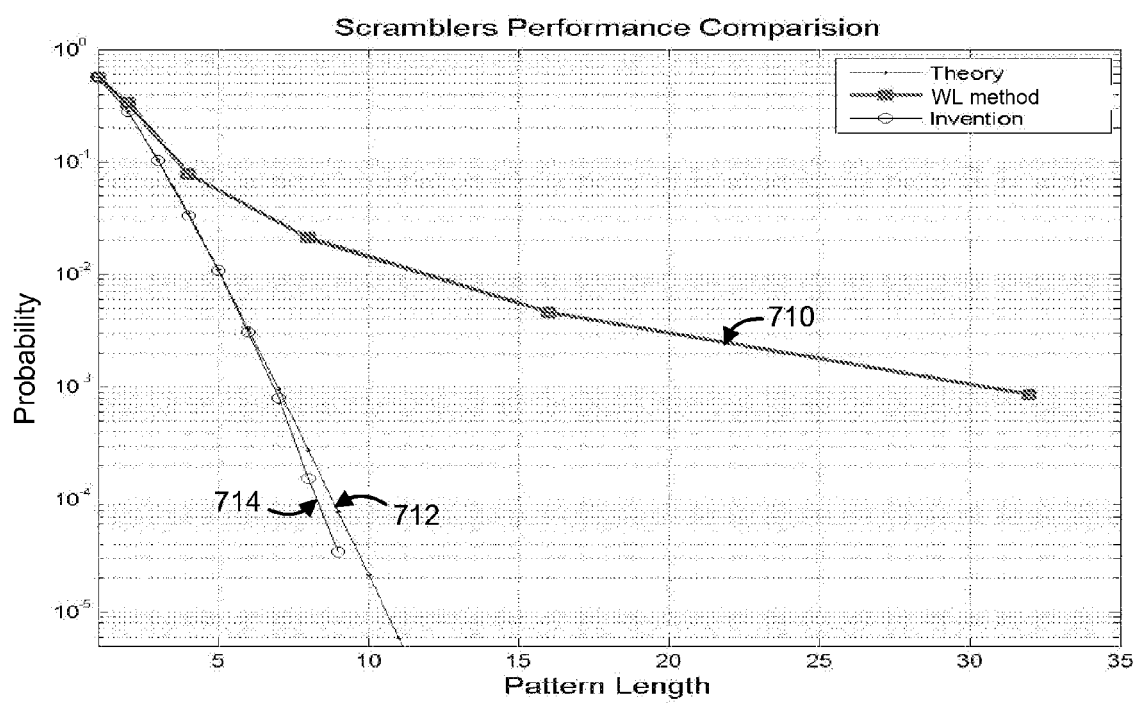
FIG. 7 depicts a performance comparison chart.

FIG. 7 depicts a performance comparison chart. This chart shows the performance advantage of the invention over a "WL method," which uses a systematic function of the word line to generate a seed for scrambling. The x-axis denotes the pattern length. The pattern length is the length of a specific constant pattern of length 'z' which appears if the data is random at a certain probability. Due to insufficiently random behavior of the scrambler, the pattern appears on the bit line with higher probability. The y-axis denotes the probability of a bit to appear in a pattern of length 'z' while only blocks that include such a pattern are considered. The pattern is any pattern of cells in the same state, for example if we are considering an MLC flash device (with two bits per cell) and pattern length of six, and the states are marked E, A, B and C, then the following four options for length five pattern exist: EEEEE, AAAAA, BBBBB, CCCCC. For the sake of simplicity of the simulation we only test for one of these options, say only EEEEE. The probability for a state to appear in such pattern if the data is random is therefore: $5 \times (1/4)^4 \times (1 1/4)^2 \approx 1.1 \times 10^{-2}$. This is the "theory" curve appearing in FIG. 1h.

The computation is as follows. Once a specific cell is identified at state 'E' (in this case) then its four neighboring cells (in the BL, for example) have to have the same states, so we multiply by $(1/4)^4$. Further, the cell can appear in any of the five locations in the pattern so we multiply by '5'. Both cells at the edge of the pattern, i.e., before the pattern starts and after the pattern ends, and cannot hold state 'E'; otherwise, the pattern length would be longer. Therefore they may have any of the other three states. The probability for that is $(1 1/4)^2$]. Specific patterns such as all ones or all zeros were tested. Curve 710 denotes the WL method result, curve 712 denotes the theoretical result with the invention, and curve 714 denotes the measured results with the invention. The probability of error is significantly lower with the invention than with the WL method.

Generalizations

A number of generalizations of the basic invention are considered, as follows.

Lattice Structure

The invention naturally generalizes to encompass any storage device having a lattice structure, where the writing of new data is restricted to certain patterns in the lattice.

General Scrambling Keys

The page number n, the section number s, and the pseudo-random number associated with block m, can be viewed as a scrambling key, used for scrambling the data. The problem addressed by the present invention is the requirement for a function to generate a good scrambling key. As mentioned, choosing an independent pseudo-random number for every page provides a good scrambling key, but has a high price in terms of memory requirements.

Choosing a scrambling key which is a linear systematic function of the page number as a seed to a pseudo random number generator, provides a good key for the individual page; however, it may lead to correlation with keys generated for other pages.

Assuming all previous data is successfully scrambled, the scrambling key for the current data to be scrambled should satisfy two properties:

1. Be a good scrambling key for the current data (as isolated data).

2. Do not generate correlations with previous data.

Therefore, any function satisfying the above two conditions may be considered as an appropriate function for generating a scrambling key.

Scrambling Keys Generated by Hash Functions

As mentioned, using an independent pseudo random number for a seed for each page generates random data without correlations along the bit lines, or across blocks, but this solution requires extra amount of flash memory consumption for storing the keys, while systematic functions are easy to calculate, do not require memory resources, but on the other hand, do not generate adequate scrambling keys.

An option which enjoys the benefits from both worlds is to use a hash function of the page number to generate a scrambling key. A hash function is, in many senses, a random function, so we can expect to obtain a good scrambling key, while the required resources for computing the function are minimal.

Descrambling

Descrambling is the recovery of the original data from the scrambled data. It is the opposite operation to scrambling, but if scrambling is done via an XOR operation, then descrambling is achieved by performing the scrambling operation on the scrambled data. This is true as long as the engine employed for generation of the random sequence does not involve feedback from the scrambled data itself. Note that the seeds for the pseudo-random number generators can be easily obtained during descrambling and therefore need not be constantly stored, in one possible approach. The seeds can be deduced from the block, page and/or section from which data is being read and descrambled, for instance. In anther approach, the seeds for the pseudo-random number generators are stored.

Overview of Example Memory System

One example of a memory system suitable for implementing the present invention uses the NAND flash memory structure, which includes arranging multiple transistors in series between two select gates. The transistors in series and the select gates are referred to as a NAND string.

Figure 8:
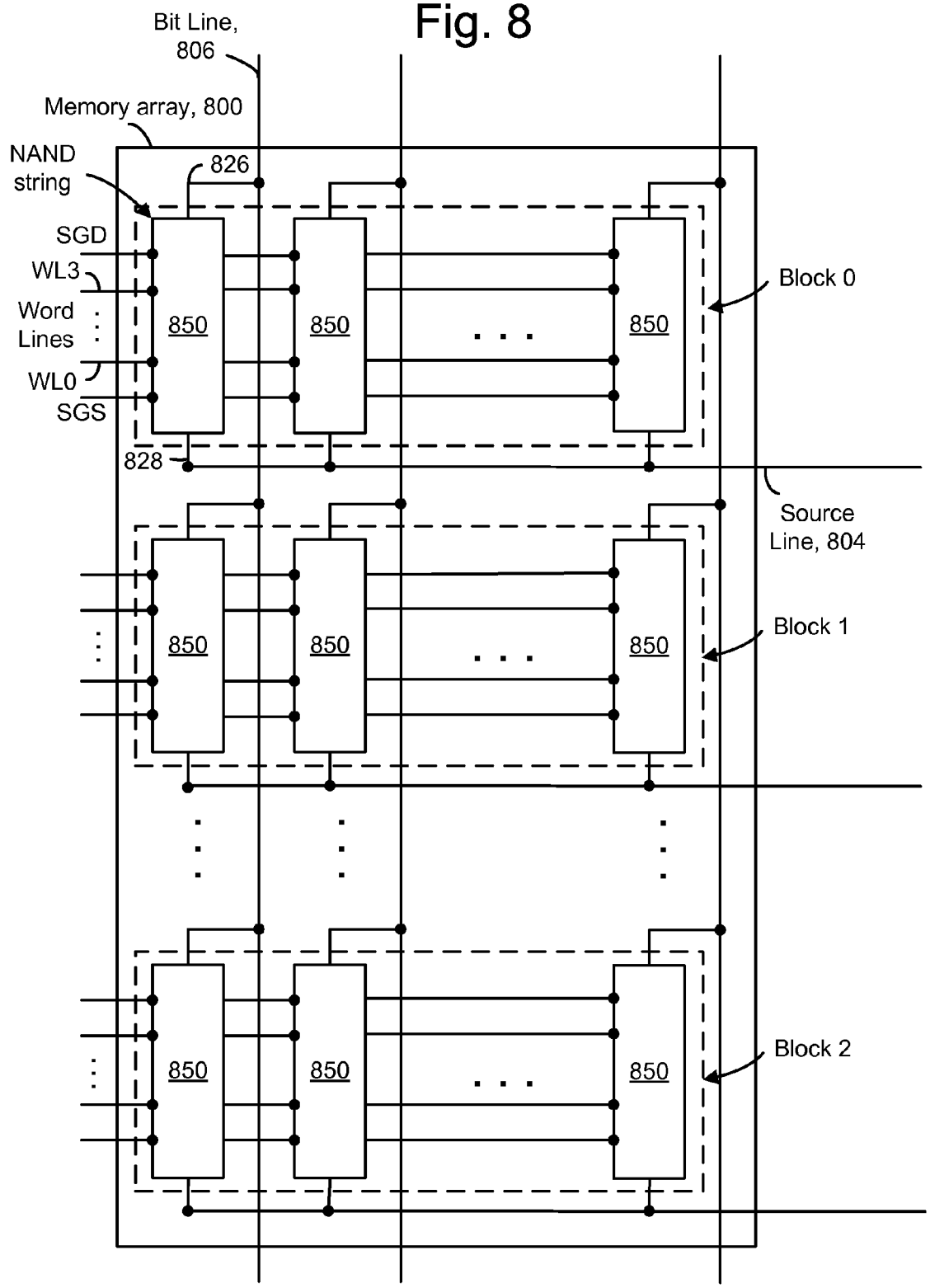
FIG. 8 is a block diagram of an array of NAND flash storage elements.

FIG. 8 is a block diagram of an array of NAND flash storage elements. Along each column, a bit line is coupled to the drain terminal of the drain select gate for the associated NAND string. For example, a bit line 806 is coupled to the drain terminal 826 of the drain select gate of the NAND string 850. Along each row of NAND strings, a source line 804 may connect all the source terminals 828 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Figure 9:
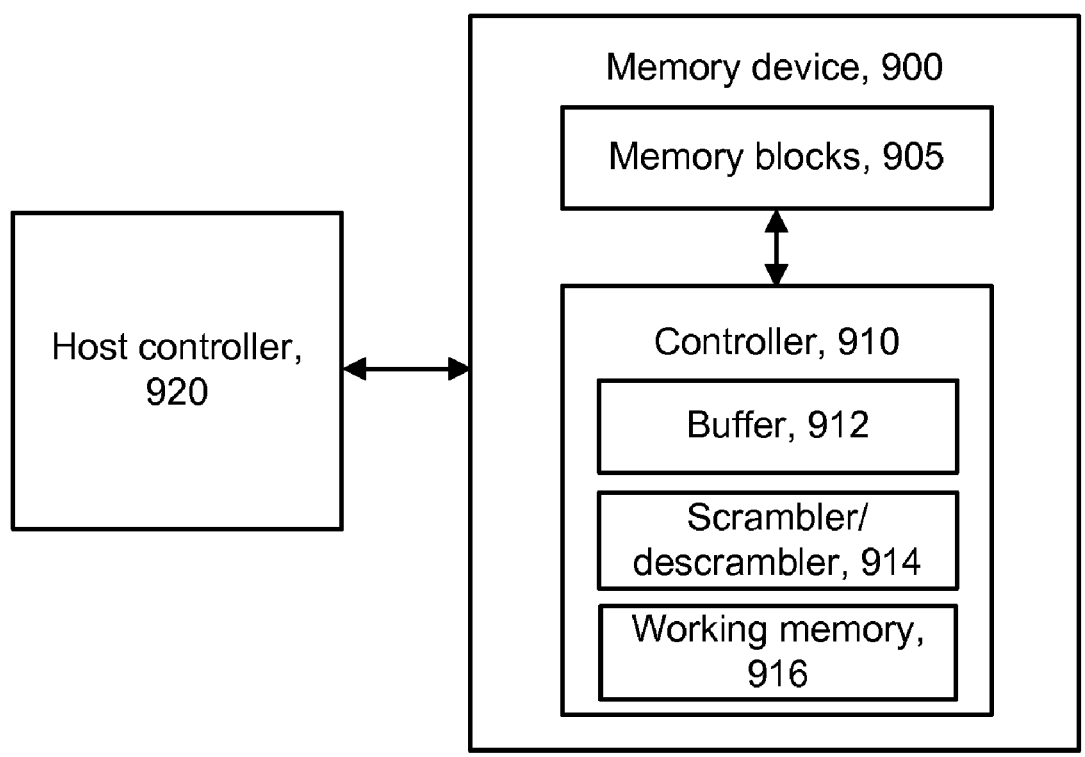
FIG. 9 depicts an overview of a host controller and a memory device.

FIG. 9 depicts an overview of a host controller and a memory device in a storage system. The memory device 900 alone may also be considered to be a storage system. The memory device 905 includes memory blocks 905 and a controller 910 for performing operations such as programming/verifying, reading, scrambling and descrambling. The controller 910 includes a buffer 912, a scrambler/descrambler 914 and a working memory 916. The controller 910 may use the scrambler/descrambler 914 to perform scrambling and descrambling operations as discussed herein.

The memory device may be formed on a removable memory card or USB flash drive, for instance, which is inserted into a host device such as a laptop computer, digital camera, personal digital assistant (PDA), digital audio player or mobile phone. The host device may have its own controller for interacting with the memory device, such as to read or write user data. For example, when reading data, the host controller can send commands to the memory device indicating an address of user data to be retrieved. The memory device controller converts such commands into command signals that can be interpreted and executed by control circuitry in the memory device. The host controller 920 may be considered to be an entity which is outside of, or external to, the memory device. The memory device may include one or more memory die, for instance, and the host controller may be outside the one or more memory die.

The memory device responds to a read command by reading the data from the storage elements and making it available to the host controller. In one possible approach, the memory device stores the read data in the buffer 912 and informs the host controller when the data can be read. The host controller responds by reading the data from the buffer and sends another command to the memory device to read data from another address. For example the data may be read page by page. The host controller may process the read data to determine a threshold voltage distribution of the storage elements of the memory device. In another approach, control circuitry of the memory device determines the threshold voltage distribution. Further details of example embodiments of a memory device are provided below.

A typical memory system includes an integrated circuit chip that includes the controller 910, and one or more integrated circuit chips that each contains a memory array and associated control, input/output and state machine circuits. The memory device may be embedded as part of the host system, or may be included in a memory card that is removable and insertable into a mating socket of a host system. Such a card may include the entire memory device, or the controller and memory array, with associated peripheral circuits, may be provided in separate cards.

Note that intelligence for carrying out the techniques discussed herein can be provided in the host and/or the memory device.

Figure 10:
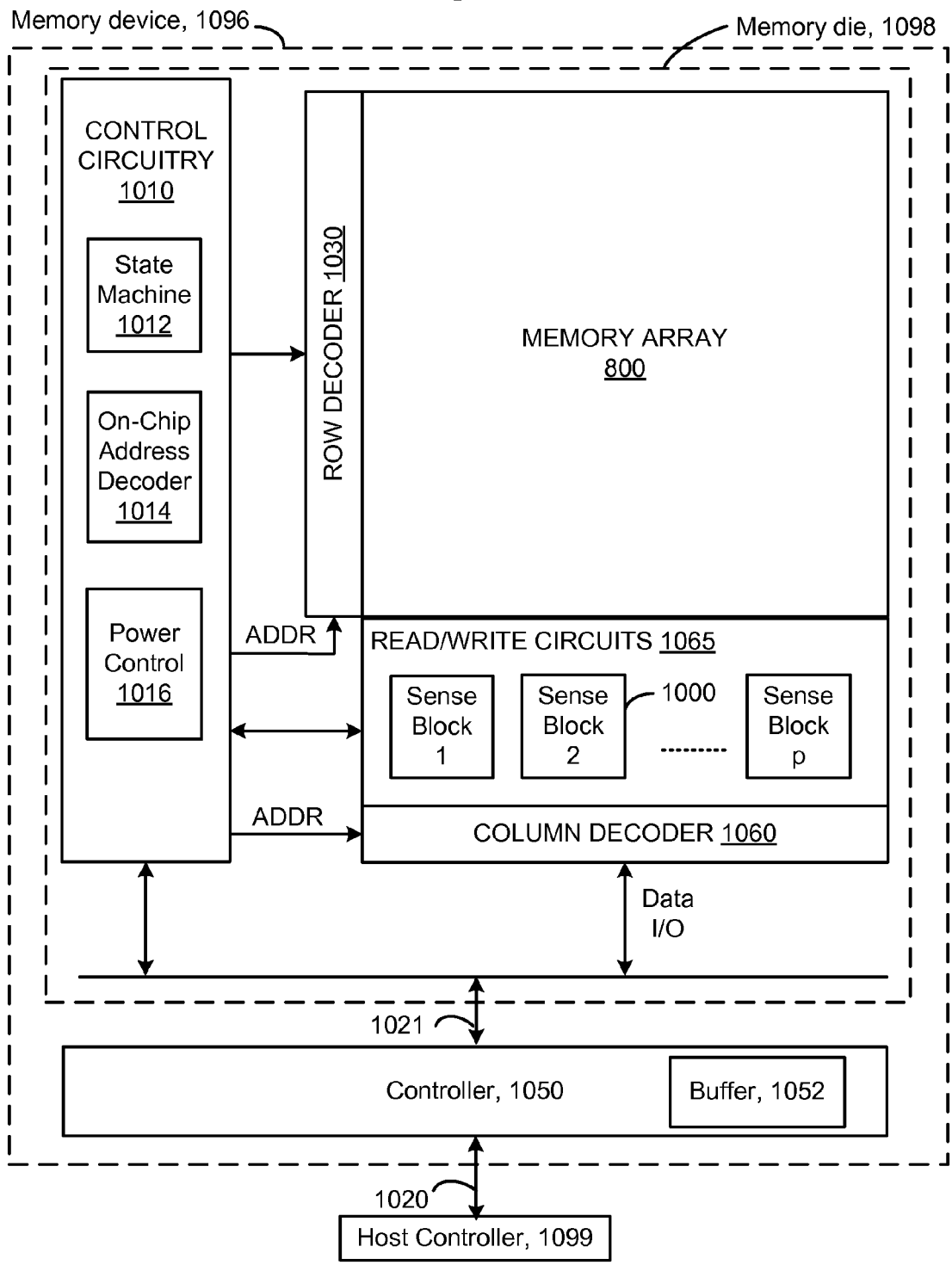
FIG. 10 is a block diagram of a non-volatile memory system using single row/column decoders and read/write circuits.

FIG. 10 is a block diagram of a non-volatile memory system using single row/column decoders and read/write circuits. The diagram illustrates a memory device 1096 having read/write circuits for reading and programming a page of storage elements in parallel, according to one embodiment of the present invention. Memory device 1096 may include one or more memory die 1098. Memory die 1098 includes a two-dimensional array of storage elements 200, control circuitry 1010, and read/write circuits 1065. In some embodiments, the array of storage elements can be three dimensional. The memory array 200 is addressable by word lines via a row decoder 1030 and by bit lines via a column decoder 1060. The read/write circuits 1065 include multiple sense blocks 1000 and allow a page of storage elements to be read or programmed in parallel. Typically a controller 1050 is included in the same memory device 1096 (e.g., a removable storage card) as the one or more memory die 1098. Commands and Data are transferred between the host and controller 1050 via lines 1020 and between the controller and the one or more memory die 1098 via lines 1021.

The control circuitry 1010 cooperates with the read/write circuits 1065 to perform memory operations on the memory array 800 (FIG. 8). The control circuitry 1010 includes a state machine 1012, an on-chip address decoder 1014 and a power control module 1016. The state machine 1012 provides chip-level control of memory operations. For example, the state machine may be configured to perform read and verify processes. The on-chip address decoder 1014 provides an address interface between that used by the host or a memory controller to the hardware address used by the decoders 1030 and 1060. The power control module 1016 controls the power and voltages supplied to the word lines and bit lines during memory operations. For example, the power control module 1016 can provide a control gate read voltage to a selected word line, and read pass voltages to unselected word lines, for use during read operations and in determining a threshold voltage distribution of a set of storage elements. The power control module 1016 may include one or more digital-to-analog converters, for instance.

In some implementations, some of the components of FIG. 10 can be combined. In various designs, one or more of the components (alone or in combination), other than storage element array 200, can be thought of as a managing or control circuit. For example, one or more managing or control circuits may include any one of, or a combination of, control circuitry 1010, state machine 1012, decoders 1014/1060, power control 1016, sense blocks 1000, read/write circuits 1065, controller 1050, host controller 1099, etc.

The data stored in the memory array is read out by the column decoder 1060 and output to external I/O lines via the data I/O line and a data input/output buffer 1052. Program data to be stored in the memory array is input to the data input/output buffer 1052 via the external I/O lines. Command data for controlling the memory device are input to the controller 1050. The command data informs the flash memory of what operation is requested. The input command is transferred to the control circuitry 1010. The state machine 1012 can output a status of the memory device such as READY/BUSY or PASS/FAIL. When the memory device is busy, it cannot receive new read or write commands.

In another possible configuration, a non-volatile memory system can use dual row/column decoders and read/write circuits. In this case, access to the memory array by the various peripheral circuits is implemented in a symmetric fashion, on opposite sides of the array, so that the densities of access lines and circuitry on each side are reduced by half.

The foregoing detailed description of the invention has been presented for purposes of illustration and description. It is not intended to be exhaustive or to limit the invention to the precise form disclosed. Many modifications and variations are possible in light of the above teaching. The described embodiments were chosen to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of writing data into a page of a flash memory device, where the pages of the flash memory device are grouped into blocks that are each erasable as a single unit, the method comprising:
   receiving data to be stored in the page;
   scrambling the data to generate first scrambled data, where the scrambling depends on a number of the page within a block containing the page;
   calculating second scrambled data that is a function of the first scrambled data and another number, wherein the another number depends on a block number of the block containing the page; and
   writing the second scrambled data into the page.

2. The method of claim 1 wherein the first scrambled data is an XOR of the received data and a number which is a function of the number of the page within the block containing the page.

3. The method of claim 1 wherein the second scrambled data is an XOR of the first scrambled data and the number of the page within the block containing the page.

4. The method of claim 1 wherein the another number does not depend on the number of the page within the block containing the page.

5. The method of claim 1 wherein the scrambling depends nonlinearly on the number of the page within the block containing the page.

6. The method of claim 5 wherein the nonlinear dependency comprises at least one of a modulo operation and a multiplication over a finite field.

7. The method of claim 1 wherein the page comprises multiple sections, and the scrambling also depends on a number of a section within the page.

8. The method of claim 7 wherein the scrambling depends nonlinearly on the number of the section within the page.

9. The method of claim 1 wherein the number of the page within the block containing the page is a pseudo random number.

10. The method of claim 1 wherein the number of the page within the block containing the page is a random number.

11. A method of writing data into a page of a flash memory device, where the pages of the flash memory device are grouped into blocks that are each erasable as a single unit, the method comprising:
    receiving data to be stored in the page;
    scrambling the data to generate first scrambled data, where the scrambling depends on a number and wherein the number depends on a block number of the block containing the page;
    calculating second scrambled data that is a function of the first scrambled data and a number of the page within the block containing the page; and
    writing the second scrambled data into the page.

12. The method of claim 11 wherein the number on which the scrambling depends does not depend on the number of the page within the block.

13. The method of claim 11 wherein the second scrambled data is a non-linear function of the number of the page within the block containing the page.

14. The method of claim 11 wherein the page comprises multiple sections, and the second scrambled data depends on a number of a section within the page.

15. The method of claim 14 wherein the second scrambled data depends nonlinearly on the number of the section within the page.

16. The method of claim 11 wherein the number on which the scrambing depends is a pseudo random number.

17. A method of descrambling first data from a page of a flash memory device, where the pages of the flash memory device are grouped into blocks that are each erasable as a single unit, the method comprising:
  reading the first data from the page;
  calculating a number, wherein the number depends on a block number of a block containing the page;
  descrambling the first data using the number to provide second data; and
  descrambling the second data based on a number of the page within the block containing the page to provide third data.

18. The method of claim 17 wherein the third data is an XOR of the second data and a number which is a function of the number of the page within the block containing the page.

19. The method of claim 17 wherein the number which depends on the block number of the block containing the page, does not depend on the page number within the block.

20. The method of claim 17 wherein the page comprises multiple sections, and at least one of the descrambling of the first data and the descrambling of the second data, depends on a number of a section within the page.

21. The method of claim 17 wherein the number which depends on the block number of the block containing the page, is a pseudo random number.

* * * * *